US012706441B2

(12) United States Patent
Cheung et al.

(10) Patent No.: US 12,706,441 B2
(45) Date of Patent: Aug. 11, 2026

(54) MICRO-RING LASER BANDWIDTH ENHANCEMENT WITH MICRO-RING RESONATOR

(71) Applicant: HEWLETT PACKARD ENTERPRISE DEVELOPMENT LP, Houston, TX (US)

(72) Inventors: Stanley Cheung, Milpitas, CA (US); Di Liang, Santa Barbara, CA (US); Raymond G. Beausoleil, Milpitas, CA (US); Michael Renne Ty Tan, Milpitas, CA (US); Wayne Victor Sorin, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 885 days.

(21) Appl. No.: 17/875,367

(22) Filed: Jul. 27, 2022

(65) Prior Publication Data

US 2024/0039244 A1 Feb. 1, 2024

(51) Int. Cl.
*H01S 5/14* (2006.01)
*H01S 5/026* (2006.01)
*H01S 5/10* (2021.01)

(52) U.S. Cl.
CPC ............ *H01S 5/142* (2013.01); *H01S 5/0265* (2013.01); *H01S 5/1071* (2013.01)

(58) Field of Classification Search
CPC ......................... H01S 5/14–142; H01S 5/1071
See application file for complete search history.

(56) References Cited

U.S. PATENT DOCUMENTS

2005/0185681 A1* 8/2005 Ilchenko ................. H01S 5/146 372/20
2009/0323751 A1* 12/2009 Ji .......................... H01S 5/1021 372/50.124

(Continued)

FOREIGN PATENT DOCUMENTS

JP H10261837 A * 9/1998

OTHER PUBLICATIONS

JP H10261837 A Description Translation (Year: 1998).*

(Continued)

*Primary Examiner* — Tod T Van Roy
*Assistant Examiner* — Hunter Jared Nelson
(74) *Attorney, Agent, or Firm* — Sheppard Mullin Richter & Hampton LLP

(57) ABSTRACT

Implementations disclosed herein provide semiconductor resonator based optical multiplexers that achieve enhanced bandwidth range of light emitted therefrom. The present disclosure integrates silicon devices into resonator structures, such as micro-ring resonators, that couples a side mode with a lasing mode and resonantly amplifies coupled light to output light having an enhanced bandwidth with respect to the lasing mode. In some examples, the optical multiplexers disclosed herein include a bus waveguide; a first resonator structure optically coupled to the bus waveguide and comprising an optical amplification mechanism that generates light and a single mode filter to force the generated light into single-mode operation; and a second resonator structure optically coupled to the first resonator structure and comprising a phase-tuning mechanism. The phase-tuning mechanism can be controlled to detune phase of light in the second resonator relative to the light in the first resonator.

20 Claims, 14 Drawing Sheets

(56) References Cited

U.S. PATENT DOCUMENTS

| | | | | |
|---|---|---|---|---|
| 2012/0063484 | A1 | 3/2012 | Goddard et al. | |
| 2016/0226215 | A1* | 8/2016 | Podoleanu | H01S 5/146 |
| 2020/0313389 | A1* | 10/2020 | Bilenko | H01S 5/4087 |
| 2022/0085573 | A1* | 3/2022 | Koyama | H01S 5/18308 |
| 2023/0335973 | A1* | 10/2023 | Segev | H01S 5/34333 |

OTHER PUBLICATIONS

An integrated parity-time symmetric wavelength-tunable single-mode microring laser (Year: 2016).*

Chu, Fei-Hung, "Simulation of strongly injection-locked semiconductor ring lasers", Feb. 2, 2016, 142 pages.

Ding et al., "Reflectance bandwidth and efficiency improvement of light-emitting diodes with double-distributed Bragg reflector", Applied Optics, vol. 56, No. 15, May 20, 2017, 7 pages.

Hiraki et al., "32-Gbit/s Heterogeneously Integrated Mach-Zehnder Modulator with 250-??m-long III-V/Si MOS-capacitor Phase Shifter", IEEE, 2017, 3 pages.

Kang et al., "A microring resonator with an integrated Bragg grating: A compact replacement for a sampled grating distributed Bragg reflector", Apr. 16, 2010, 10 pages.

Lamponi, M., "Hybrid III-V on silicon lasers for telecommunication applications", HAL, Jan. 1, 2013, 182 pages.

Liu et al., "An integrated parity-time symmetric wavelength-tunable single-mode microring laser", May 12, 2017, 6 pages.

Zhang et al., "Hybrid quantum-dot microring laser on silicon", Optica, vol. 6, No. 9, 2019, 7 pages.

* cited by examiner 500
520
510
$R_3$
$R_2$
$R_1$
$\delta_{c2}$
$\delta_{c1}$
$T_1$
$Q_2$
$\kappa_2$
$Q_1$

MICRO-RING LASER BANDWIDTH ENHANCEMENT WITH MICRO-RING RESONATOR

STATEMENT OF GOVERNMENT RIGHTS

This invention was made with Government support under Award No. DE-AR0001039 awarded by DOE, Office of ARPA-E. The Government has certain rights in this invention.

BACKGROUND

High-performance computers demand highly dynamic data rates, e.g., a few terabytes per second communication bandwidth between switch hubs, and hundreds of gigabytes per second bandwidth between nodes and hubs, in order to overcome challenges due to rapidly growing traffic. Integrated photonic interconnect on silicon is believed to a solution for low-cost, energy efficient, and high-speed data communications because of advantages in high-volume throughput and dense integration. Applied with signal multiplexing techniques, e.g., wavelength division multiplexing (WDM), large bandwidth data links may be achievable on silicon. In such a system, an on-chip, robust, low-power consumption laser source is an important component as well as one of the fundamental limits to the silicon platform.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
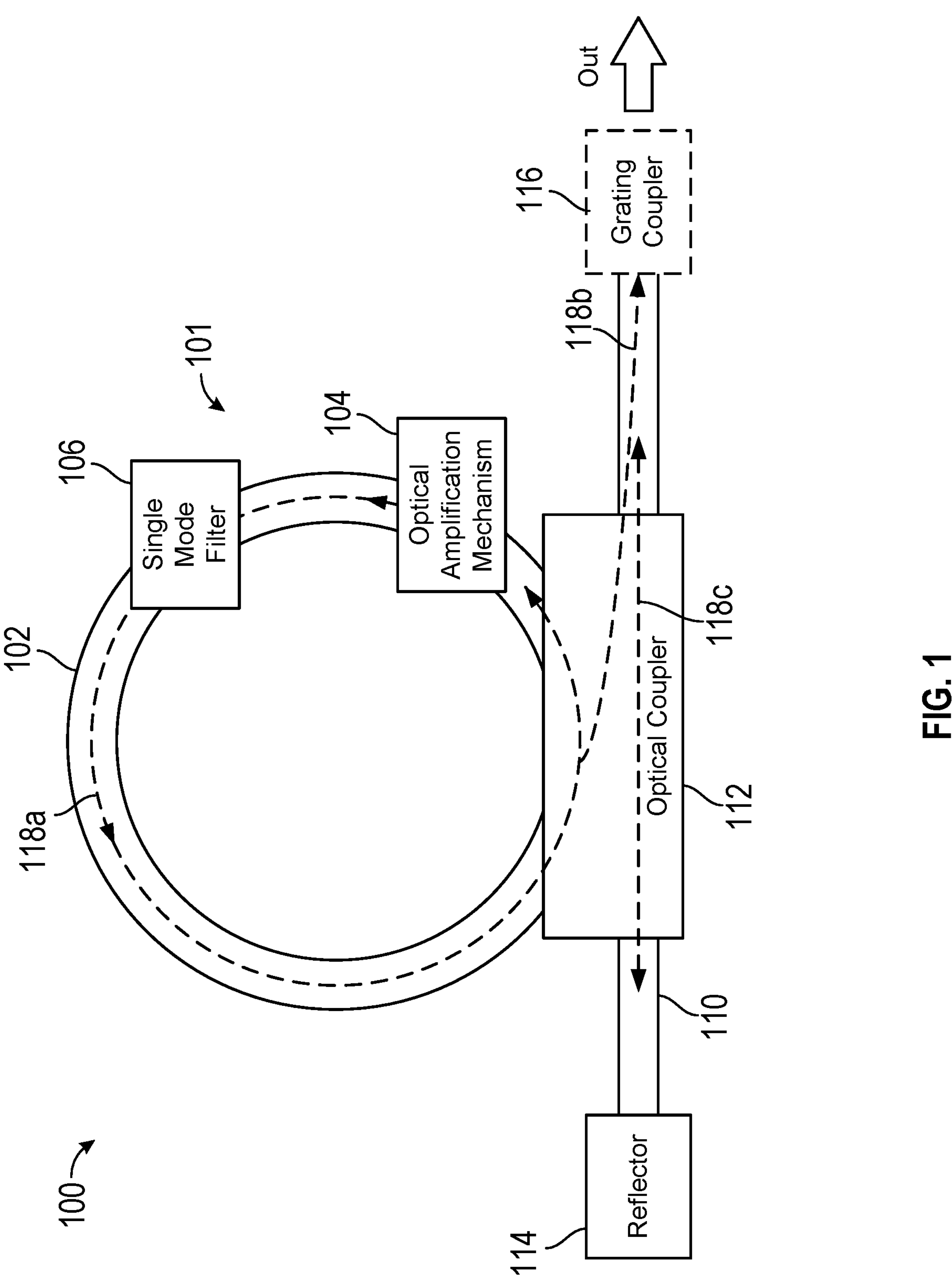
FIG. 1 illustrates a resonator-based multiplexer according to implementations disclosed herein.

The figures are not exhaustive and do not limit the present disclosure to the precise form disclosed.

DETAILED DESCRIPTION

As alluded to above, high-performance computing demands highly dynamic data rates that are energy efficient and provide for increasingly larger transmission rates. However, large data transmission rates are not possible without large bandwidths. Laser sources, while an important component integrated photonic interconnect silicon platforms, conventionally emit spatially coherent light. Thus, the bandwidth of light emitted from conventional lasers has a linewidth that is magnitudes narrower than other light sources.

Various approaches have been used to enhance laser bandwidth. One approach is photon-photon resonance (PPR), which couples a side mode with a laser mode and resonantly amplifies laser light generation within a cavity to enhance speed of directly modulated laser (DML) diodes. However, the convention PPR approaches rely on external injection locking techniques to stimulate laser light emission.

Accordingly, example implementations disclosed herein provide for semiconductor resonator-based multiplexers that provide for enhanced bandwidth range of light emitted therefrom. For example, implementations disclosed herein provide for a multi-resonator structure that outputs light with a data bandwidth that improves conventional approaches, such as PPR approaches described above, by 2 to 3 times. Furthermore, some implementations disclosed herein provide for self-seeding techniques (also referred to herein as self-injection locking) that remove the need of an external light source as a seed signal.

In an example implementation, multi-resonator structure is optically coupled to a bus waveguide via an optical coupler that evanescently couples light propagating in a first resonator structure into the bus waveguide. The first ring resonator structure includes an optical amplification mechanism that generates light within the first resonator structure based on voltage bias applied to the optical amplification mechanism. Based on a voltage, the optical amplification mechanism stimulates light emission that is injected into the first resonator structure. The first ring resonator structure also includes a single mode filter that forces single mode operation of light generated in the first ring resonator structure.

A second resonator structure is optically coupled to the first ring resonator structure via an optical coupler that evanescently couples the light generated in the first ring resonator structure into the second ring resonator structure. The second ring resonator structure includes a phase-tuning mechanism configured to tune a resonant frequency of the second resonator structure by inducing a change in the refractive index therein, for example, through carrier injection (e.g., charge accumulation), charge depletion, or changing temperature of a portion thereof or the entire length. Based on the change in the refractive index, the phase-tuning mechanism operates to detune a phase light propagating in the second resonator structure with respect to the light in the first resonator structure.

Where the first resonator structure is modulated, light propagating in the second resonator structure couples with modulated light in the first structure to amplify a side mode and generate output light having a wider (e.g., enhanced)

bandwidth than under unity gain conditions. For example, a side mode under modulation at a detuned phase is resonantly amplified within the second resonator structure and couples with the lasing mode to enhance (e.g., widen) the bandwidth of the output light. To achieve bandwidth enhancement, certain conditions must be optimized such that the phase difference between the light in the second resonator structure and the lasing mode in the first resonator structure may be tuned to be approximately one-half the linewidth of the lasing mode (e.g., the light in the first resonator structure under cold cavity/unity gain conditions).

Accordingly, examples disclosed herein provide for a semiconductor-based resonator multiplexer capable of providing an increased bandwidth that may be used as a carrier for increased data transmission rates. Furthermore, integration on silicon platforms allows for increased temperature stability and facilitates use of SiGe avalanche photodiodes (APD) as photodetection monitors in dense wavelength-division multiplexing (DWDM) silicon photonics optical system applications.

Furthermore, some implementations disclosed herein provide for optical modulators employing a heterogeneous MOSCAP adjoined to an optical waveguide. Thus, charge accumulation and/or depletion may be induced within the MOSCAP by applying a voltage bias. The charge accumulation and/or depletion modifies a refractive index of the optical waveguide and causes a phase shift in a beam of light propagating through the optical waveguide, thereby phase-modulating the beam of light. By implementing a MOSCAP and applying voltage bias, the speed at which the phase shift occurs can be increased, with improved accuracy and efficiency. The improved phase tuning achieved through the MOSCAP translates to wider wavelength shifts which may be used for direct high-speed modulation and/or alignment to resonator-based modulators.

It should be noted that the terms "optimize," "optimal", "improve", "improved" and the like as used herein can be used to mean making or achieving performance as effective or perfect as possible. However, as one of ordinary skill in the art reading this document will recognize, perfection cannot always be achieved. Accordingly, these terms can also encompass making or achieving performance as good or effective as possible or practical under the given circumstances, or making or achieving performance better than that which can be achieved with other settings or parameters.]

Figure 13:
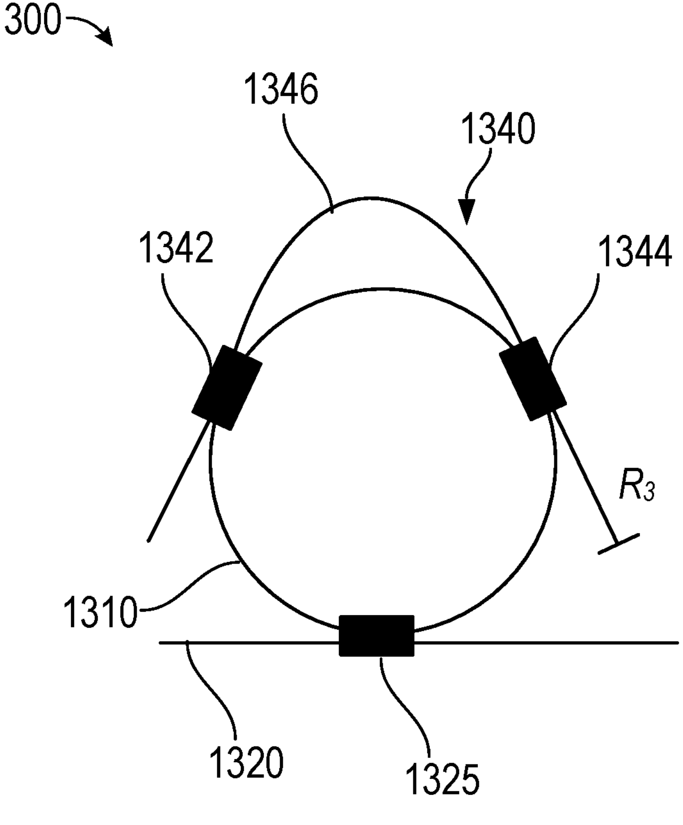
FIG. 13 illustrates an example implementation of a single mode filter that may be included in optical multiplexer according to implementations disclosed herein.

FIG. 1 illustrates a resonator-based multiplexer 100. The multiplexer 100 comprises a resonator structure 101 (also referred to as cavity) and a bus waveguide 110. The resonator structure 101 includes a waveguide 102 optically coupled to the bus waveguide 110 via an optical coupler 112. The resonator structure 101 also comprises an optical amplification mechanism 104 and a single mode filter 106. The optical amplification mechanism 104 is configured to generate light 118*a* that propagates in the waveguide 102, while the single mode filter 106 forces a single mode operation of the light 118*a* at a resonant wavelength of the resonator structure 101. The single mode filter 106 may be, for example but not limited to, a Mach-Zehnder interferometer (MZI), grating, or the like. FIG. 13 illustrates am example implementations of a single mode filter 106 as an MZI. In some examples, some or all of the elements of the multiplexer 100 may be part of a photonic integrated circuit (PIC), for example, the waveguide 102 and the bus waveguide 110 may be formed of silica, silicon, or other Group IV material (e.g., germanium, silicon carbide, silicon germanium, and so on).

The waveguide 102 may be a closed loop formed of semiconductor material, such as silicon or other Group IV material. The shape of the loop may be, for example but not limited to, circular, elliptical, a racetrack shape, etc., thereby forming a ring resonator or cavity. The waveguide 102 may have a resonant frequency to resonantly amplify light propagating therein at the resonant frequency and then evanescently couple the light into the bus waveguide 110 via the optical coupler 112. For example, light 118*a*, propagating in the waveguide 102, may be evanescently coupled to the bus waveguide 110 (e.g., light 118*b*) based on a coupling coefficient. The optical coupler 112 may be, for example, but not limited to, a Mach-Zehnder interferometer, directional coupler, or the like. In some implementations, the optical coupler 112 may be a tunable coupler. For example, the coupling coefficient as related to the coupling length may be tuned.

The multiplexer 100, according to various implementations, is configured for self-seeding (or self-injection locking) at the wavelength of light generated by the optical amplification mechanism 104. For example, the optical amplification mechanism 104, in self-seeding implementations, generates light 118*a* within the waveguide 102 at the resonant wavelength based on properties of the optical amplification mechanism 104. The waveguide 102 is adapted to resonant at the same wavelength as the light 118*a*. As light 118*a* resonates within the waveguide 102, light 118*a* functions as a seed signal for optical amplification mechanism 104, which forces the optical amplification mechanism 104 to emit additional light at the frequency of the seed signal (e.g., akin to an optical feedback), thereby providing optical gain that amplifies the light 118*a* propagating in the waveguide 102. According to various illustrative implementations, the optical amplification mechanism 104 includes an optically active material, such as for example, quantum dots (QD), quantum wells (QW), quantum-dash structures, or any structure that can create carrier population inversion for optical gain in the waveguide. In these implementations, light 118*a* is generated when a voltage bias is applied to the optically active material, thereby stimulating emission (e.g., photoluminescence), for example in the case of quantum dots, by the optically active material at a wavelength corresponding to the energy difference between conductance band and valence band or the transition between discretized energy states. An example optical amplification mechanism 104 is described below in connection with FIG. 2, which may be used for self-injection locked implementations or injection locked via an external optical source.

Conventionally, self-seeding techniques resulted in linewidths that are narrower that those compared with injection locked lasers that rely on an external source as a seed signal. The linewidth indicates the purity of light frequency in light. A narrow linewidth is not a direct measure or indicator of the physical width of the light (the same as the visual or geometric diameter of light projected on a surface), but rather, an indicator of what proportion of the light is composed of a single light frequency or wavelength. Thus, implementations herein are able to enhance this linewidth by coupling a side mode, as described herein, that results in a wider bandwidth of available frequencies.

In some implementations, the multiplexer 100 may be configured for injection locking at the wavelength of light generated by an external optical source. For example, the bus waveguide 110 may receive light from an external source, such as a comb laser or other light generating source, which is evanescently coupled into waveguide 102. The received light functions as a seed signal for optical amplification mechanism 104, which causes the optical amplification mechanism 104 to emit additional light at the frequency of the seed signal (e.g., akin to an optical feedback), thereby providing optical gain that amplifies the light propagating in the waveguide 102.

According to some examples, the bus waveguide 110 may include a reflector 114 at a first end of the bus waveguide 110 opposite a second or output end. The reflector 114 may reflect light 118*c* propagating in the bus waveguide 110 toward the waveguide 102. Reflected light from reflector 114 may be coupled back into the waveguide 102 or propagate toward the second end. The reflector 114 may be, for example, a highly reflective distributed Bragg reflector (DBR), a mirror, loop mirror, etched semiconductor (e.g., an etched semiconductor facet with metal coating or dielectric coating), tunable reflector, and the like. While the reflector 114 may have any reflectivity desired, in some implementations, the reflector 114 may be a reflectivity of greater than 25%. Reflector 114 may function to cause the resonator structure 101 to operate in one direction (e.g., unidirectional), for example, due to reflecting light 118*c* back toward the waveguide 102. Some of reflected light couples back into the waveguide 102 and the remainder of the reflected light propagates toward the output end of the bus waveguide. Additionally, in some implementations, the portion of the reflected light coupled back into the waveguide 102 may serve as the seed signal for the optical amplification mechanism 104. At the output end of the bus waveguide 110, a grating coupler 116 may optionally be provided (as indicated by the dashed lines) to facilitate coupling the output light, for example, to downstream components of a PIC.

Figures 2A, 2B:
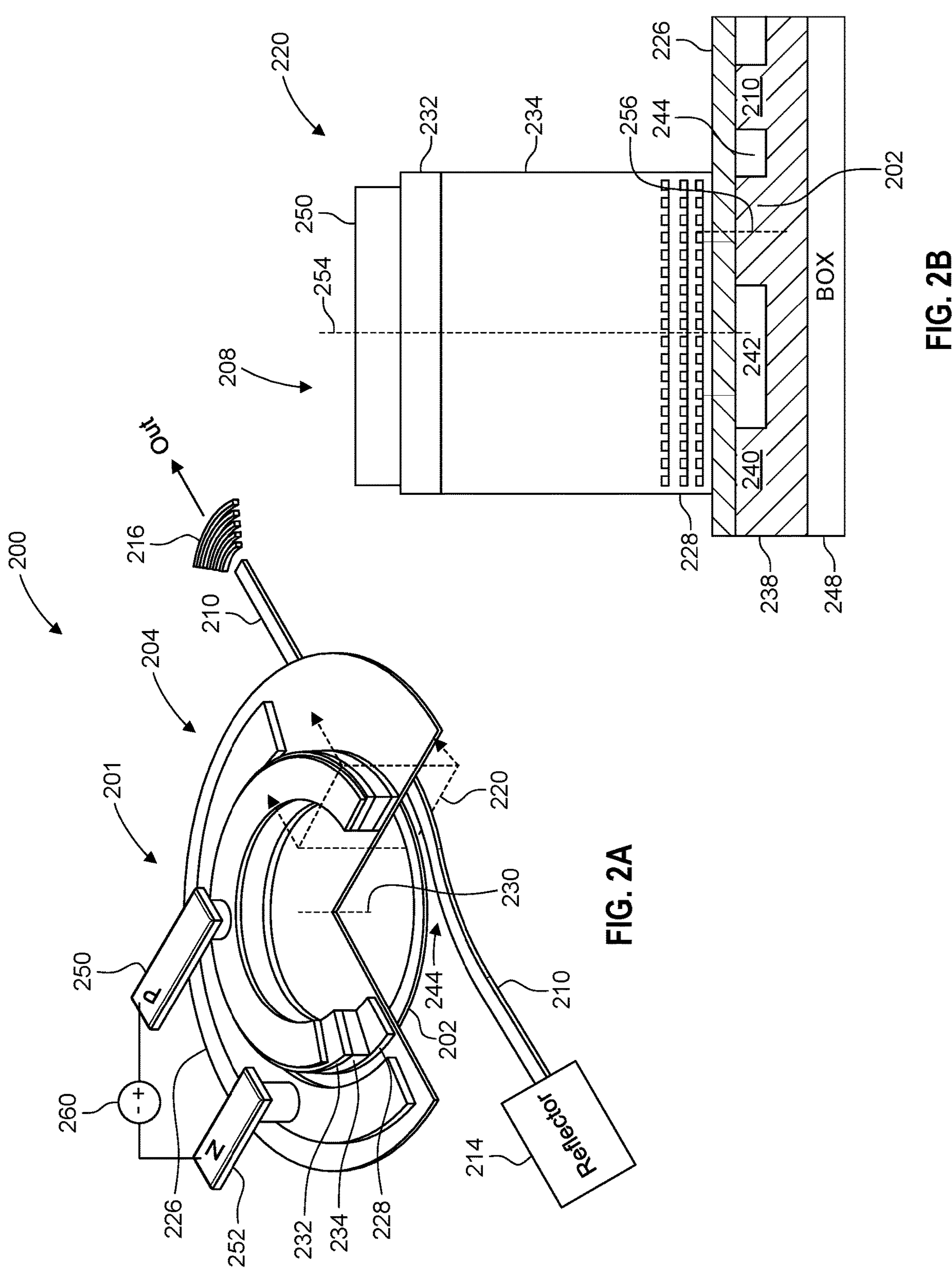
FIGS. 2A and 2B illustrate an example multiplexer comprising an optical amplification mechanism according to an implementation disclosed herein.

FIGS. 2A and 2B illustrate an example multiplexer 200 according to an implementation disclosed herein. FIG. 2A illustrates a perspective view of the multiplexer 200 and FIG. 2B illustrates a cross-sectional view of the multiplexer 200 taken along the plane 220. Multiplexer 200 is an example implementation of the resonator-based multiplexer 100 of FIG. 1, except that the single mode filter 106 is not shown in FIGS. 2A and 2B. Multiplexer 200 includes a resonator structure 201 comprising a waveguide 202 optically coupled to a bus waveguide 210 via evanescent optical coupling. The resonator structure 201 and waveguide 202 are example implementations of resonator structure 101 and waveguide 102, respectively, and bus waveguide 210 is an example implementation of bus waveguide 110. Thus, as described above in connection with FIG. 1, evanescent coupling may be achieved via an optical coupler, such as optical coupler 112. Additionally, the waveguide 202 may be a closed loop structure around a central axis 230 having a shape, for example but not limited to, that is circular, elliptical, a racetrack shape, etc., thereby forming a ring resonator or cavity. A reflector 214 may be provided at a first end of the bus waveguide 210 and light is output from the second end of the bus waveguide 210. The reflector 214 may be substantially similar to the reflector 114. Furthermore, the multiplexer 200 may also include an optional grating coupler 216, which may be substantially similar to grating coupler 116 for facilitating coupling of output light to downstream components, if present. In various implementations, the waveguide 202 and bus waveguide 210 may be formed of a semiconductor material, such as silicon or other Group IV material.

The resonator structure 201 comprises an optical amplification mechanism 204 configured to generate light at a resonant frequency of the waveguide 202, which is injected into the waveguide 202 and resonates therein. The optical amplification mechanism 204 is an example implementation of the optical amplification mechanism 104 of FIG. 1. Light propagating in the waveguide 202 may be coupled to the bus waveguide 210 and/or used as seed signal for self-seeding of the optical amplification mechanism 204. Light may be generated by the optical amplification mechanism 204, for example, by applying a voltage bias to contact electrode 250 and 252 (e.g., via power source 260 controlled by a computing device, such as computing system 1500 of FIG. 15), which causes an optically active medium 228 to photoluminescent and inject light into the waveguide 202. The voltage bias may be modulated to induce amplitude modulation of the photoluminescence and, as a result, the intensity of light propagating in the waveguide 202.

Additionally, modulating the voltage bias causes a change in the phase of the light 118*a* generated by the optical amplification mechanism 204. For example, in a case of unity gain at the optical amplification mechanism 204, the light emitted by optical amplification mechanism 204 is at a first wavelength (e.g., resonant wavelength) having a first phase. The condition of unity gain is also referred to as a cold cavity condition. Under modulation, the voltage bias (e.g., change from unity gain condition to a second gain condition) causes a change in carrier concentration at an interface between the waveguide 202 and the optical amplification mechanism 204. The change in carrier concentration changes the index of refraction of the waveguide 202, which induces a phase shift in the light propagating in the waveguide 202. The change in refractive index of the waveguide 202 induces a change in the resonance frequency of the waveguide. That is, under modulation, the light 118*a* is modulated from a unity gain condition (e.g., first wavelength at first phase) to a second gain condition (either added gain or loss) that causes the light 118*a* in waveguide 202 to propagate at the first wavelength having a second phase that is offset from the first phase. The offset in the phase is based on the change of refractive index, and thus may correspond to the gain or loss added by optical amplification mechanism 204.

In the illustrative example of FIGS. 2A and 2B, the optical amplification mechanism 204 includes a buried oxide (BOX) layer 248 grown on a substrate (not shown), for example, such as a silicon dioxide layer. The optical amplification mechanism 204 also comprises a layer 238 of semiconductor material formed on the BOX layer 248. The semiconductor material layer 238 may be a silicon layer or layer of other Group IV materials. The semiconductor material layer 238 comprises the waveguide 202 and bus waveguide 210 formed therein and separated from each other via trench 244 (e.g., an air trench or air gap). A structure 240 may also be formed in the semiconductor material layer 238 for supporting a central portion of the optical amplification mechanism 204. The structure 240 is formed on a side of the waveguide 202 opposite the bus waveguide 210, having a trench 242 therebetween. The trench 242 and 244 may function to confine the optical mode within the waveguide 202 in the lateral direction. In various implementations, the waveguide 202 may be a single mode waveguide. Light propagating in waveguide 202 may be evanescently coupled into the bus waveguide 210 via the trench 244, for example, as a directional coupler in this example. The BOX layer 248 may be provided to confine the optical mode in a longitudinal direction (e.g., into the layers provided on the BOX layer 248). Control of the width of the trench 244 may alter the coupling ratio between the waveguide 202 and bus waveguide 210 (e.g., a larger width results in a smaller coupling ratio).

The optical amplification mechanism 204 includes a cathode 226 comprising a first material and a portion of which is formed on a side of the semiconductor material layer 238 opposite the BOX layer 248. The cathode 226 contacts at least the waveguide 202 and the bus waveguide 210 and is electrically coupled to the contact electrode 252. An interface may be positioned between the waveguide 202 and the cathode 226 at which carrier concentration may change due to voltage bias applied to the electrodes 250 and 252. In some implementations, the cathode 226 may contact the waveguide 202, as shown in FIG. 2B, providing for the interface. In other example, as described in connection with FIGS. 6-13, a thin layer comprising Group III-V oxides may be formed as the interface between the cathode 226 and the waveguide 202.

The optical amplification mechanism 204 also comprises a mesa structure 208 formed on cathode 226. The mesa structure 208 is provided for generating light, which is provided to the waveguide 202 based on applying a voltage bias between contact electrodes 250 and 252. A bias applied to the mesa structure 208 may act to initiate a seed signal and/or modulate optical gain or loss added to the waveguide 202. The mesa structure 208 overlaps at least the waveguide 202 in the longitudinal direction. A central longitudinal axis 254 of the mesa structure 208 may be offset from a central longitudinal axis 256 of the waveguide 202 in a direction toward the central axis 230.

The mesa structure 208 includes an anode 232 formed on a dopped semiconductor material layer 234, which is disposed on an optically active medium 228 formed on the cathode 226. The contact electrode 250 is disposed on the anode 232 opposite the cathode 226 in the longitudinal direction. The dopped semiconductor material layer 234 comprises a second material that is dissimilar from the first material. The cathode 226 spans trench 244 and trench 242 formed in the semiconductor material layer 238. The trenches 242 and 244 may function to confine the optical mode in the lateral direction and the lateral width of trench 244 may be selected to control the coupling between waveguides 202 and 210.

In various implementations, the cathode 226 comprises a layer of Group III-V material as the first material, such as gallium arsenide (GaAs), indium phosphide (InP), or other compounds of indium, gallium, phosphorus, and arsenic. The cathode 226 may be formed by, for example but not limited to, deposition, wafer bonding, monolithic growth, or other fabrication techniques. The anode 232 may comprise a layer of Group III-V material that is oppositely dopped as the cathode III-V as the second material. For example, the cathode 226 may be a negatively-doped material (e.g., a n-doped semiconductor layer comprising Group III-V material) as the first material, and the anode 809 may be a positively-doped material (e.g., a p-doped semiconductor layer).

As described above, the mesa structure 208 is configured to generate light and induce optical gain in the waveguide 202. For example, optical gain may be achieved by light-emission generated within the mesa structure 208, which produces light that can be injected into the waveguide 202. Light injected into the waveguide 202 functions as optical gain and/or a seed signal for self-seeding. Optical gain may be achieved, for example, by biasing the optically active medium 228 to provide additional light at the resonant frequency that is added to light already propagating in the waveguide 202.

To achieve stimulated light emission, the optically active medium 228 is disposed in the doped semiconductor material layer 234 adjacent to the cathode 226. In some implementations, doped semiconductor material layer 234 may be grown optically active medium 228, such that the layers are monolithic. The optically active medium 228 may comprise, for example, quantum dot (QD), quantum wells (QW), quantum-dash (QD) structures, or any structure that can create carrier population inversion for optical gain as an optical gain medium. In an example, the optically active medium 228 may comprise InAs and/or GaAs QDs. The doped semiconductor layer 234 comprising the optically active medium 228 may be formed of a doped Group III-V material, such as AlGaAs or the like, which is doped to a polarity opposite to that of the cathode 226 (e.g., positively-doped Group III-V material) as the second material.

To generate light, a forward voltage bias may be applied between the electrodes 250 and 252. The bias causes a carrier concentration change through accumulation that leads to stimulated emission in the optically active material 228, thereby generating light. Emitted light traverses the layers and is injected into the waveguide 202, in which the light then propagates. Accordingly, by biasing the voltage applied between the electrodes 250 and 252, a seed signal may be generated and/or optical gain can be added to the waveguide 202 via mesa structure 208. The amount of optical gain may be modulated based on changing the magnitude of the voltage bias applied to the mesa structure 208.

In some implementations, the optical amplification mechanism 204 may be biased to induce optical loss through light-absorption within the mesa structure 208, for example, by absorbing optical energy from light propagating in waveguide 202. A reverse voltage bias applied to the optically active medium 228 causes electron-hole band bending which results in absorption, for example, absorption of optical energy and/or light.

While certain materials are described as negatively- or positively-doped, implementations are not limited thereto, and the polarity doping may be switched. For example, while the above example described the cathode 226 as negatively-doped and the anode 232 and doped semiconductor layer 234 as positively-doped, the polarity of each layer may be switched such that the cathode 226 is positively-doped and the anode 232 and semiconductor layer 234 may be negatively-doped.

In an example implementation, the multiplexer 200 is a hybrid micro-ring laser comprising QD as the optically active medium 228, which contains eight layers of InAs/GaAs QDs with a photoluminescence wavelength around 1200 nm. The hybrid micro-ring comprises of a first ring structure comprising Group III-V material and a second ring comprising silicon (or other Group IV material). The first ring comprises the mesa structure 208 and the cathode 226, while the second ring comprises the waveguide 202. The first ring has a width that is larger than the second ring, for example, 5 μm versus 1.5 μm. The first and second rings are concentric rings (e.g., sharing a central axis 230). This offset may optimize the coupling between the first ring and the waveguides 202 and 210. In this illustrative example, the cathode 226 may be an n-GaAs layer and the anode 232 may be a p-GaAs. The fundamental lasing mode overlaps with the first ring and the second ring and then to the bus waveguide 210. The bus waveguide 210 may be curved along with the second ring to increase coupling length between bus waveguide 210 and the waveguide 202, and the trench 244 may be between 200 nm and 250 nm to provide efficient coupling therebetween.

Figure 3:
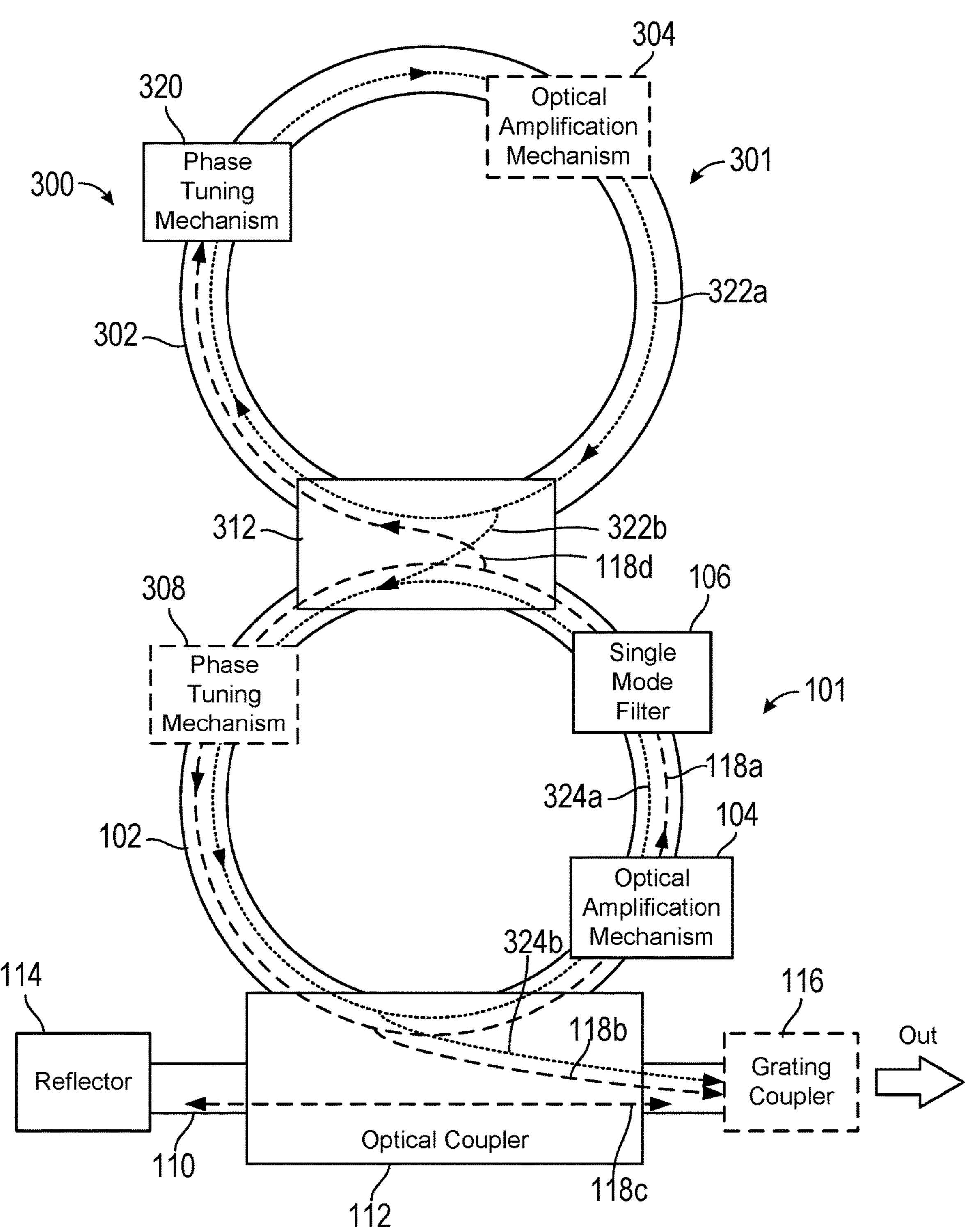
FIG. 3 depicts an example resonator-based multiplexer having a plurality of resonator structures according to implementations disclosed herein.

FIG. 3 depicts an example resonator-based multiplexer 300 having a plurality of resonator structures (also referred to as cavities) according to implementations disclosed herein. The plurality of resonator structures are optically coupled therebetween and a first resonator structure is optically coupled to a bus waveguide. For example, as illustrated in FIG. 3, a first resonator structure may be implemented as resonator structure 101, which is optically coupled to a second resonator structure 301 via optical coupler 312. While FIG. 3 illustrates multiplexer 300 comprising two resonator structures, the present disclosure is not limited to only two. Implementations disclosed herein may comprise any N number (where N is an integer of two or more) of resonator structures, for example, 3, 4, 5, etc. The N number of resonator structures may be cascaded in a daisy chain configuration, each individually coupled to the first resonator structure 101, or any combination thereof.

As described above in connection with FIG. 1, the resonator structure 101 of FIG. 3 comprises waveguide 102 having a resonance frequency at a first frequency; optical amplification mechanism 104 configured to emit light 118*a* at the resonant frequency that is provided to the waveguide 102; and a single mode filter 106 that forces light propagating in the waveguide 102 into single-mode operation. Thus, light 118*a* comprises a lasing mode that propagates at the first wavelength. The resonant frequency at the first frequency evanescently couples out of the waveguide 102 into the second resonator structure 301. The resonator structure 101 may be provided as the resonator structure 201 of FIG. 2 comprising waveguide 202 having optical amplification mechanism 204 formed thereon.

As described above with reference to FIG. 1, a portion of light 118*a* propagating in the waveguide 102 may be coupled into bus waveguide 110 as light 118*b*. That is, the waveguide 102 and bus waveguide 110 are optically coupled via optical coupler 112, which provides for evanescently transferring light 118*b* into bus waveguide 110. Furthermore, reflector 114 may be provided to direct light 118*c* propagating in the bus waveguide 110 toward the output (and optional grating coupler 116).

The second resonator structure 301 comprises a waveguide 302 that is optically coupled to the waveguide 102, via a second optical coupler 312. Second optical coupler 312 may be similar to optical coupler 112, in that it provides for coupling light 118*d* into the waveguide 302, for example, through evanescent coupling based on a coupling coefficient. The optical coupler 312 may be, for example, but not limited to, a Mach-Zehnder interferometer, directional coupler, or the like. In some implementations, the optical coupler 312 may be tunable.

The waveguide 302 may be provided as a closed loop, where the shape of the loop may be, for example, circular, elliptical, or a racetrack shape. The waveguide 302 may also be formed of a semiconductor material, such as silicon or other Group IV material and may have the same or different length than that of waveguide 102. The waveguide 302 may have a resonant frequency at a second frequency to evanescently couple light 322*b* at the second frequency out of the waveguide 302 into the waveguide 102, while light propagating at non-resonant frequencies of the waveguide 302 continue to propagate with no coupling effect to the waveguide 102.

The second resonator structure 301 also comprises a phase-tuning mechanism 320 that functions to tune the resonant frequency of the waveguide 302, thereby tuning the frequency of light 322*a*. The phase-tuning mechanism 320 tunes the resonant frequency by inducing a change in the refractive index of the waveguide 302 over a certain length, for example, through carrier injection (e.g., charge accumulation), charge depletion, or changing temperature of a portion or all of the waveguide 302. In other words, phase-tuning in the second resonator structure 301 induces a phase shift in the resonant frequency relative to the resonant frequency of the first resonator structure 101 resulting in an optical delay (e.g., a phase offset). In the example configuration of FIG. 3, by adjusting the resonant frequency of the second resonator structure 301 and coupling the light back into the first resonator structure 101, light 322*b* at the second frequency is combined with light at the first frequency, which can be output via the bus waveguide 110.

In a case where the multiplexer 300 generates light under continuous wave operation (e.g., unity gain), the first resonator structure 101 has a resonance frequency at a first frequency corresponding to the main lasing mode. The phase-tuning mechanism 320 operates to offset the resonance frequency of the second resonator structure 301 relative to the resonance frequency of the first resonator structure 101. This offset causes light 322*b* to resonant in the second waveguide 302 at a second frequency. Because resonance frequency of the first resonator structure 101 is at the first frequency, non-resonant frequencies of the first resonator structure 101 only weakly couple into the waveguide 102. That is, light 322*b* at the second frequency is a non-resonant frequency of the first resonator structure 101 and, therefore, is stored in the second resonator structure 301 and at best weakly couples to the first resonator structure 101. The weak coupling results in a weak side mode in the output light.

Figures 4, 5:
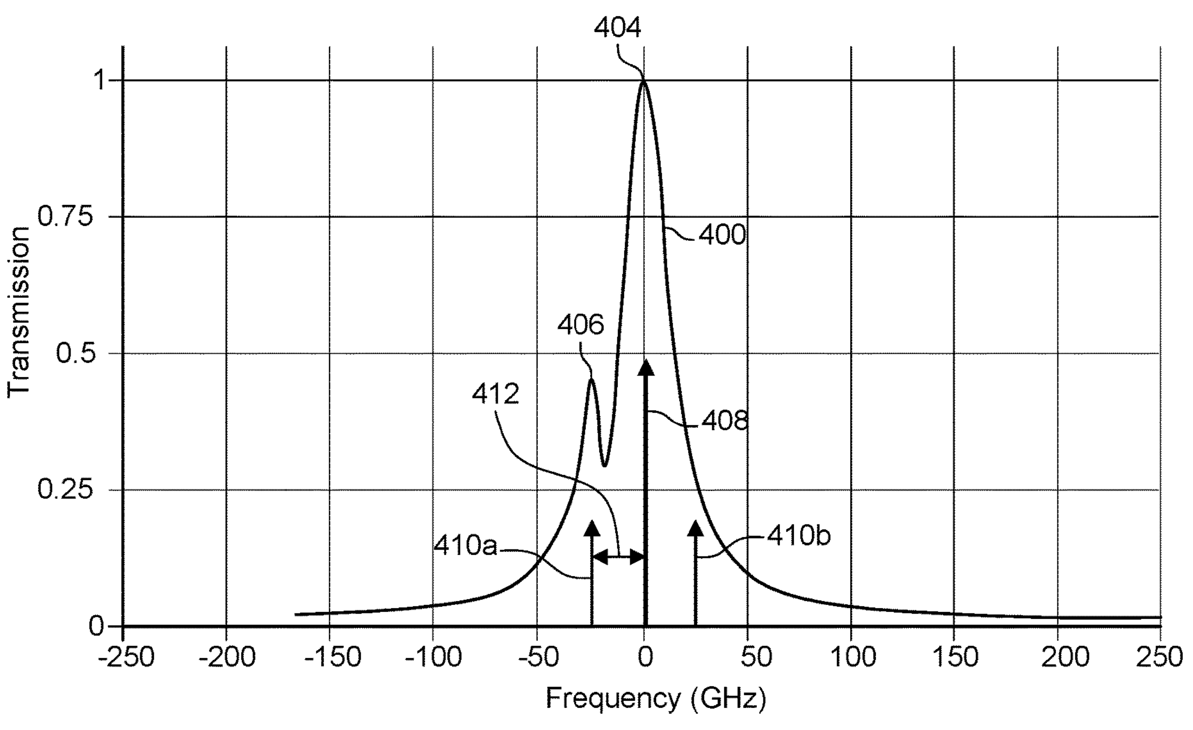
FIG. 4 is a plot depicting an example normalized transmission of light output from the multiplexer of FIG. 3 as a function of phase in terms of frequency according to implementations disclosed herein.
FIG. 5 illustrates a schematic model representation of the multiplexer of FIG. 3 according to implementations disclosed herein.

However, in a case where the first resonator structure 101 is modulated (e.g., by the optical amplification mechanism 104), light 322*a* propagating in the second resonator structure 301 couples with modulated light 118*a* to amplify the side mode and generate output light having a wider bandwidth than under unity gain. For example, modulating the first resonator structure 101 between unity gain condition and a second gain condition (either forward or backward) results in the modulation of the amplitude of the light 118*a*. Additionally, as described above, the phase of light 118*a* is modulated to a second phase offset from the first phase under unity gain conditions. If the modulation is controlled so to align the second phase of light 118*a* with the phase of light 322*b* (e.g., due to offset induces by the phase-tuning mechanism 320), the light 322*b* couples with the modulated phase to constructively interfere. As a result, the side mode at the second phase is amplified and couples with the lasing mode to enhance (e.g., widen) the bandwidth of the output light (as shown in FIG. 4 described below). In various embodiments, the phase offset is controlled to be one half the cold cavity linewidth of the lasing mode. In some cases, while the bandwidth is enhanced, due in part to partial destructive interference when the first resonator structure 101 is at unity gain conditions during modulation, output power may be reduced at the output relative to continuous wave operation.

As an illustrative example where optical amplification mechanism 204 is implemented as optical amplification mechanism 104 in FIG. 3, the voltage bias applied to electrodes 250 and 252 can be modulated between a first bias and second bias, where the first bias corresponds to unity gain conditions and a second bias corresponds to the second gain condition. The modulation causes a change in carrier concentration that results in a change in the refractive index of waveguide 202 (e.g., waveguide 102). The change in refractive index causes a shift in the resonance frequency of the waveguide 202. The phase-tuning mechanism 320 is also controlled to change the refractive index of waveguide 302, thereby setting the resonance frequency of the second waveguide 302. In the case where the resonance frequency of the waveguide 202 aligns (e.g., approximately the same) with the resonance frequency of the second waveguide 302, light 322*b* is resonantly amplified in second resonator structure 301, which optically couples into the waveguide 202 due to the alignment in resonance frequencies under modulation (e.g., light 324*a* in FIG. 3). Light 324*a* is resonantly amplified in first resonator structure 101 and then coupled into the bus waveguide 110 as light 324*b*. The constructive interference, when the resonator structure 101 is modulated to the second gain condition, results in amplification of the side mode of light 324*a*. The amplified side mode light 324 couples with lasing mode light 118*a* to provide output that is wider than the lasing mode alone. That is, the amplified side mode functions to increase the full width half maximum linewidth of the output light.

FIG. 4 is a plot depicting example normalized transmission of light output from multiplexer 300 as a function of phase in terms of frequency according to implementations disclosed herein. FIG. 4 illustrates a line 400 of light output from the multiplexer 300 under modulation, while arrow 408 illustrates the phase of a lasing mode of light generated by the optical amplification mechanism 104 under unity gain conditions and arrows 410*a* and 410*b* illustrate the phase of the side modes under second gain conditions. The plot includes offset 412, which depicts a frequency offset of the side mode of arrows 410*a* and 410*b* relative to the lasing mode of arrow 408. Thus, as described above, if phase-tuning mechanism 320 of the second resonator structure 301 is set to align the phase of light 322*b* with the side mode of arrow 410*a* (e.g., align resonance frequencies of waveguide 102 and 302), light from the first resonator structure 101 under second gain conditions constructively interferes with light from the second resonator structure 301, thereby producing peak 406. Under unity gain conditions, the lasing mode produces peak 404. Thus, as shown in FIG. 4, the linewidth of the resulting output light 400 is widened relative to the lasing mode considered alone.

In the illustrative example of FIG. 4, since the second resonator structure 301 is not set to align its phase with side mode of arrow 410*b*, the side mode of arrow 410*b* is a weak side mode that is overpowered by the lasing mode and adds negligible power. However, the phase-tuning mechanism 320 of second resonator structure 301 may be controlled to align with side mode of arrow 410*a* (as shown), side mode of arrow 410*b*, or both of side modes of arrows 410*a* and 410*b*. For example, the first resonator structure 101 may be modulated between second gain condition corresponding to side mode of arrow 410*a* and a third gain condition corresponding to side mode of arrow 410*b*, passing by the central lasing mode. Similarly, the phase-tuning mechanism 320 may be modulated between two phase conditions, one aligned with the side mode of arrow 410*a* and another aligned with side mode of arrow 410*b*. Thus, the bandwidth can be further enhanced.

As another example, as noted above the multiplexer may have N number of resonator structures. That is, there may be a plurality of second resonator structures (e.g., N−1 number), each having a corresponding phase-tuning mechanism controlled to align with a side mode of the light in the first resonator structure 101. If the plurality of second resonator structures align with the same side mode, then the resulting amplification of the side mode may be increased due to constructive interference from the plurality of resonators. If the plurality of second resonators structures align with a plurality of side modes (e.g., each aligned with a different side mode), then a plurality of amplified side modes may be generated (e.g., a plurality of side peaks similar to peak 406) at different offsets from the lasing mode. Implementations here may use a combination of the above examples as desired.

In FIG. 4, the lasing mode is positioned at a 0 frequency for illustrative purposes and for ease of explanation. For example, the lasing mode is at 0 GHz and the phase of side modes are offset by approximately 25 GHz relative to the lasing mode. Other frequency offsets may be used depending on the application and design parameters. However, in various implementations, the phase-tuning mechanism 320 is set such that the resonance frequency of the second resonator structure 301 is offset relative to the resonance frequency of the first resonator structure 101 by one-half the cold cavity linewidth (e.g., unity conditions) of the lasing mode.

Referring back to FIG. 3, the first resonator structure may comprise an optional phase-tuning mechanism 308 (as indicated by the dashed line), which may be substantially similar to the phase-tuning mechanism 320. That is, the phase-tuning mechanism 308 may be operated to tune the resonant frequency of the first resonator structure by inducing a change in the refractive index of the waveguide 102 over a certain length, for example, through carrier injection (e.g., charge accumulation), charge depletion, or changing temperature of a portion or all of the waveguide 102. In other words, phase-tuning in the first resonator structure 101 may be used to induce a phase shift in the resonant frequency relative to the resonant frequency of the second resonator structure 301. The phase-tuning mechanism 308 may be used to provide fine tuning of the resonance frequency and/or to modulate optical gain/loss in the waveguide 102 relative to the second resonator structure 301, which may fine tune various conditions as described below in connection with FIG. 5.

While the first resonator structure 101 may include the phase-tuning mechanism 308, some implementations of the first resonator structure 101 do not include any phase-tuning mechanism. In these implementations, the first resonator structure 101 is operated to provide optical gain, generate light 118*a*, and/or modulate the optical gain therein. Any phase shift attributed to light 118*a* is a result of the operation of the optical amplification mechanism 104 (as described above in connection with FIGS. 2A and 2B).

Additionally, the second resonator structure 301 may comprise an optional optical amplification mechanism 304 (as indicated by the dashed line), which may be substantially similar to the optical amplification mechanism 104. In the case where such a mechanism 304 is included in the second resonator structure, the optical amplification mechanism 304 may be biased to add optical gain thereby further amplifying the side mode resonating in the second resonator structure 301. Additionally, the optical amplification mechanism 304 may be biased to add optical gain and/or loss to the waveguide 302, which may fine tune various conditions as described below in connection with FIG. 5.

While the second resonator structure 301 may include the optical amplification mechanism 304, some implementations of the second resonator structure 301 are passive structures only and do not include any optical amplification mechanisms. In these implementations, the second resonator structure 301 is operated to induce the desired phase shift relative to the first resonator structure 101, and any amplification attributed to light 322*a* is through resonant amplification.

FIG. 5 illustrates a schematic model 500 representation of a multiplexer according to implementations disclosed herein. Model 500 may be representative of multiplexer 300 and may be utilized to determine design parameters of multiplexer 300. For example, the first and second resonator structures 101 and 301 are represented as cavities 510 and 520, respectively.

Cavities 510 and 520 are modeled as Fabry-Pérot interferometers, in this example, because optical resonators, be it ring resonators, Fabry-Pérot interferometers, etc., are conceptually similar. For example, cavity 510 is modeled as an optical cavity defined by two reflecting surfaces having reflected power of $R_1$ and $R_2$, respectively, between which light resonant and cavity 520 is modeled as an optical cavity defined by reflecting surfaces having reflected power of $R_2$ and $R_3$, respectively. In the case of a ring resonator, $R_3$ is set to one. During each round trip within a respective cavity, the light resonating therein experiences respective losses that correspond to a total round trip cavity loss coefficient $\delta_{c1}$ for cavity 510 and $\delta_{c2}$ for cavity 520. The respective total round trip cavity loss coefficient is a summation of the losses present in each cavity as follows:

$$\delta_{c1} = \delta_1 + \delta_{a1} + \delta_2 \quad \text{Eq. 1}$$

$$\delta_{c2} = \delta_2 + \delta_{a2} + \delta_3 \quad \text{Eq. 2}$$

Where $\delta_1$, $\delta_2$, and $\delta_3$ represent losses at the reflecting surface (e.g., an amount of light leaking through the reflecting surface) and $\delta_{a1}$ and $\delta_{a2}$ represent the loss in the respective waveguide (e.g., due to absorption of energy by the material of the waveguide). Thus, in the case of multiplexer 300, $\delta_{a1}$ and $\delta_{a2}$ represent the loss due to waveguide 102 and 302, respectively; $\delta_1$ corresponds to the fraction of transmitted power ($P_1$) that passes from the resonator structure 101 to the bus waveguide 110 (e.g., corresponding to the coupling performance of the coupler 112); $\delta_2$ represents transmitted power ($P_2$) that passes from the resonator structure 101 to the second resonator structure 301 and vice versa (e.g., corresponding to the coupling performance of the coupler 312); and $\delta_3$ corresponds to the fraction of transmitted power that passes from resonator structure 301 to the external environment, which in the case of a ring resonator is assumed to be zero. Each interface (e.g., reflecting surface in the case of Fabry-Perot interferometers or optical couplers in the case of multiplexer 300) comprises reflected power (R) and transmitted power (T) as follows:

$$T_1 = e^{-\delta_{c1}} \quad \text{Eq. 3}$$

$$T_2 = e^{-\delta_{c2}} \quad \text{Eq. 4}$$

$$R_1 = e^{-\delta_1} \quad \text{Eq. 5}$$

$$R_2 = e^{-\delta_2} \quad \text{Eq. 6}$$

Thus, optical power transmitted between cavity 510 and external components corresponds to the total round trip cavity loss coefficient $\delta_{c1}$ and the optical power transmitted between cavity 510 and cavity 520 corresponds to the total round trip cavity loss coefficient $\delta_{c2}$. Similarly, the reflected power (e.g., reflected back into the respective cavity at the interface) R1 is corresponds to the loss coefficient $\delta_1$ and the reflected power R2 is corresponds to the loss coefficient $\delta_2$.

To amplify a side-mode as described in connection with FIGS. 3 and 4, there are several conditions that may be optimized to achieve the amplification and enhance the bandwidth of the output light. A first condition is to optimize the cavities 510 and 520, relative to each other, such that a quality factor (Q factor) of the first cavity 510 ($Q_1$) is approximately equal to a Q factor of the second cavity 520 ($Q_2$). That is:

$$Q_1 \approx Q_2 \quad \text{Eq. 7}$$

According to some implementations, the Q-factors should be within ±30% of each other, while in other implementations the tolerances may be reduced. The Q factor of a given resonant cavity is provided as follows.

$$Q = \frac{2\pi f_0 E}{P} \quad \text{Eq. 8}$$

Where $f_0$ is the resonant frequency, E is the optical energy stored in the cavity, and P is the power dissipated from the cavity (e.g., transmitted and/or absorbed). The Q factor of a given resonator relates to the length of the cavity (e.g., the diameter in the case of a ring resonator) and optical losses exhibited in the cavity (e.g., total round trip cavity loss coefficients $\delta_{c1}$ or $\delta_{c2}$). Thus, the Q factors of cavity 510 and cavity 520 may be tuned, relatively to each other, by tuning the length of each cavity and/or tuning the optical losses therein. For this first condition, the coupling coefficient ($\kappa_2$) is assumed to be approximately zero, which also assumes $\delta_2$ is approximately zero.

One example approach to tuning the Q factors may be based on tuning the free spectral range (FSR) of one cavity relative to the other cavity. For example, the total round trip cavity loss coefficients $\delta_{c1}$ and $\delta_{c2}$ can be tuned based on changing a ratio of the respective FSR as follows:

$$\delta_{c2} \approx \left(\frac{FSR_1}{FSR_2}\right)\delta_{c1} \quad \text{Eq. 9}$$

Where $FSR_1$ and $FSR_2$ represent the FSR for the first and second cavity 510 and 520, respectively. Thus, tuning the FSR of one cavity relative to the other cavity changes the ratio of $FSR_1$ over $FSR_2$, which is approximately equivalent to tuning the Q factors. For example, in the case of multiplexer 300, the phase-tuning mechanism 320 may be controlled to tune the FSR of second resonator structure 301 with respect to the FSR of resonator structure 101. For example, FSR in frequency is inversely proportional to group index of a given waveguide (e.g., ratio of vacuum velocity of light to group velocity of light in the waveguide, where group velocity is the velocity with which an envelope of a pulse propagates in the waveguide). The group index can be tuned using the techniques disclosed herein to change the refractive index of a waveguide. Accordingly, changing the group index of resonator structure 301 with respect to resonator structure 101 will induce a change in the $FSR_2$ relative to $FSR_1$. As another example, FSR of a given waveguide may be tuned by changing the roundtrip length of the cavity (e.g., resonator structure 101 and/or 301) due to an inverse proportional relationship between roundtrip length and FSR. Thus, by tuning the roundtrip length of resonator structure 301 relative to resonator structure 101, according to the examples disclosed herein, the ratio of $FSR_1$ to $FSR_2$ of Eq. 9 may be tuned.

As another example, tuning the Q factors may be based on changing the resonance width of one cavity relative to the other cavity. The resonance width of each cavity may correspond to the FWHM of light propagating in each respective cavity. Tuning one FWHM relative to the other, such that the FWHMs of each cavity are approximately equal (e.g., $\Delta v_{p2} \approx \Delta v_{p1}$, where $\Delta v$ represents the FWHM of each respective cavity) may be an approximation of tuning the Q factors.

A second condition that may be used to achieve the amplification and enhance the bandwidth of the output light is to optimize the coupling coefficient between the two cavities ($\kappa_2$). The coupling coefficient ($\kappa_2$) at the interface between cavities 510 and 520 defines the amount of power that passes into the second cavity 520 from the first cavity 510, resonates in the second cavity 520, and passes back into the first cavity 510. This power transmission between cavities corresponds to the coupling efficiency between the cavities. For example, in the case of optical coupler 312, the coupling coefficient of optical coupler 312 may be the coupling coefficient ($\kappa_2$). If coupler 312 is a tunable coupler, $\kappa_2$ can be tuned via the tunable coupler 312. Alternatively or in combination, $\kappa_2$ can be tuned through control of the optical losses within the cavities as follows:

$$\kappa_2 = 1 - e^{-\delta_2} \approx \delta_2 \quad \text{Eq. 10}$$

From Eq. 10, it may follow that $$\kappa_2 \approx (.4)\left(\frac{FSR_1}{FSR_2}\right)\delta_{c1}^2 \quad \text{Eq. 11}$$

Accordingly, the coupling coefficient $\kappa_2$ may be tuned, for example, by tuning the FSRs of the cavities with respect to each other.

A third condition that may be used to achieve the amplification and enhance the bandwidth of the output light is through detuning of the resonance frequency of cavity 520 ($\Delta\theta_2$). The third condition informs how much to detune the second cavity 520 relative to the first cavity 510 (e.g., how much of a phase change to induce through phase-tuning mechanism 320). That is, the third condition relates to the phase parameter, which is related to the loss in the second cavity 520 as follows:

$$\Delta\theta_2 \approx \frac{1}{2}\delta_{c2} \quad \text{Eq. 12}$$

Accordingly, changing the phase of the second cavity 520 relative to the first cavity 510 correspond to a change in the total round trip cavity loss coefficient which may be used to optimize the Q factors and/or coupling coefficient ($\kappa_2$). For example, with reference to FIG. 3, the phase-tuning mechanism 320 can be controlled to change the phase of the second resonator structure 301 relative to the first resonator structure 101, which translates to a change in the total round trip cavity loss coefficient of the second resonator structure 301.

In the Eqs. 1-12, all parameters related to the first cavity 510 are defined at unity gain (e.g., cold cavity parameters).

Optimizing these conditions, for example, by tuning the various parameters therein, provides for coupling light propagating in the second cavity 520 with modulated light in the first cavity 510 to amplify a side mode and generate output light having a wider bandwidth than under unity gain (e.g., as described in connection with FIGS. 3 and 4). That is, the conditions may be optimized to ensure that the light in the second cavity 520 is offset, relative to unity gain condition of the first cavity 510, so to align the light in the second cavity 520 with modulated light in the first cavity 510 to provide for constructive interference. This interference along with resonant amplification within the cavities, causes the side mode to amplify and enhance the bandwidth of the light in the first cavity with respect to unity gain condition. To ensure that the bandwidth is enhanced, opposed to generating a separate peak, the offset may be controlled to be one-half the linewidth of the light in the first cavity 510 at unity gain conditions.

Phase tuning according to the implementations disclosed herein may be achieved through many different approaches. For example, phase tuning-mechanisms described throughout the present disclosure, such as phase-tuning mechanism 320 and/or optional phase-tuning mechanism 308 of FIG. 3, may be provided as any mechanism capable of inducing a phase shift in light propagating through the respective waveguide. For example, as alluded to above, phase-tuning mechanisms disclosed herein are configured to tune the resonant frequency by inducing a change in the refractive index of a resonate structure (e.g., waveguide 302 and/or waveguide 102 in FIG. 3) over a certain length, for example, through carrier injection (e.g., charge accumulation), charge depletion, or changing temperature of a portion or all of the resonator structure.

In a first example, with reference to FIG. 3, phase tuning-mechanism 320 may comprises one or more heating/cooling elements (e.g., resistive heaters, or the like) that can be operated to change the temperature of the waveguide 302. The heating elements may be, for example, a resistor (e.g., metal component) physically coupled to a portion or all of a waveguide 302. A current may then be applied to the resistor, which generates heat transferred to the waveguide 302 causing a change in temperature. Control of the current may tune the temperature so to tune the resonant frequency. A change in phase or phase shift (app) of the waveguide 302 can be induced based on a change in temperature as follows:

$$\Delta\varphi = \frac{2\pi L_H}{\lambda_0}\frac{dn}{dT}\Delta T \quad \text{Eq. 13}$$

where $L_H$ is a length of the heating element coupled to waveguide 302, dn/dT is a thermo-optic coefficient dependent on the material from which the waveguide 302 is formed (e.g., indicative of a change in refractive index with the response to temperature), $\Delta T$ is the change in temperature of the waveguide 302, and $\lambda_0$ is the free space wavelength of the light. Thus, applying or subtracting heat from the waveguide 302 will induce a change in phase, thereby changing the resonant frequency of the waveguide 302.

While the preceding discussion is made with reference to phase-tuning mechanism 320, the example provided above may be equally applied as phase-tuning mechanism 308. Reference to phase-tuning mechanism 320 is provided merely for illustrative purposes and is not intended to limit the example to only phase-tuning mechanism 320.

Figure 6A:
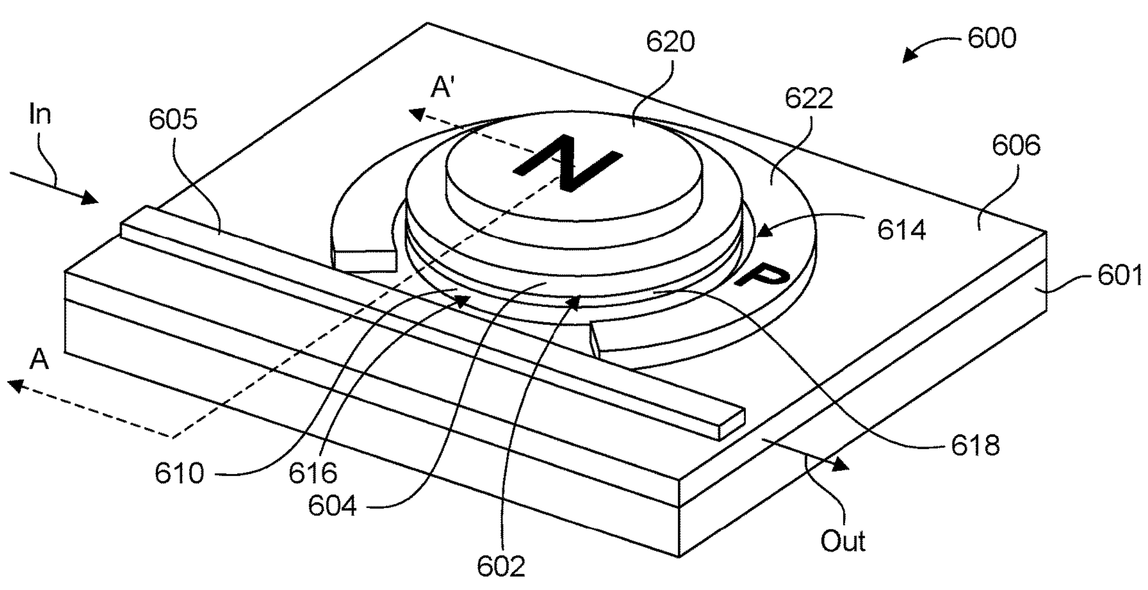
FIGS. 6A and 6B illustrate an example phase-tuning mechanism comprising a metal oxide semiconductor capacitor (MOSCAP) according implementations of the present disclosure.
Figure 6B:
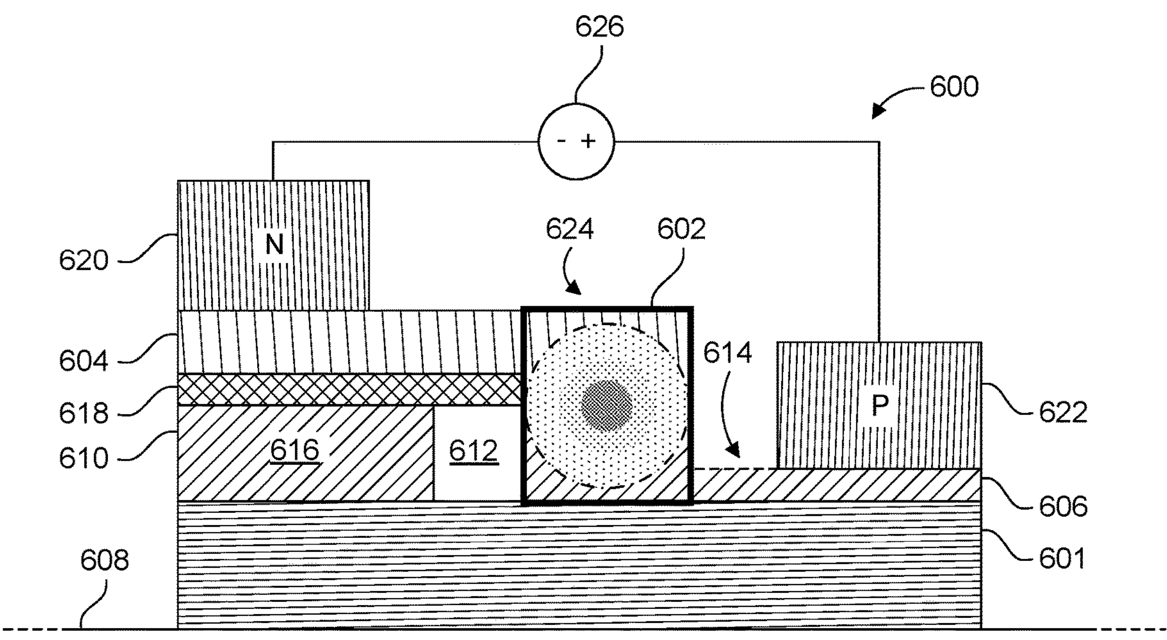

FIGS. 6A and 6B illustrate an example implementation of a phase-tuning mechanism according to implementations of the present disclosure. FIGS. 6A and 6B illustrate an example hybrid MOS ring-resonator optical modulator 600 that may be implemented as a phase-tuning mechanism, for example, phase-tuning mechanism 320 and/or phase-tuning mechanism 308 of FIG. 3. FIG. 6A is a perspective view of the optical modulator 600 and FIG. 6B is a section view of the hybrid MOS optical modulator 600 taken along a line A-A' shown in FIG. 6A.

The optical modulator 600 includes an optical waveguide 602, a cathode 604 comprising a first material and formed in the optical waveguide 602, and an anode 606 comprising a second material that is different from the first material and formed in the optical waveguide 602. The anode adjoins the cathode. A capacitor is defined between the anode and the cathode.

In some examples, a substrate 601 comprises oxide grown on an underlying layer 608. A silicon layer 610 is formed on the substrate 601. A trench 612 separates the optical modulator 600 into two portions 614 and 616. The first portion 614 comprises the anode 606. The optical waveguide 602 is formed in the anode 606. The cathode 604 is integrated to the second portion 616. The optical waveguide 602 may be an example implementation of waveguide 302 (or waveguide 102 in the case of phase-tuning mechanism 308). In various embodiments, the cathode 604 comprises a layer of Group III-V material as the first material. A MOS capacitor 624 is defined between the cathode 604 and the anode 606.

A dielectric 618 is formed between the cathode 604 and the anode 606. The dielectric 618 may be an electrically insulating material formed between the cathode 604 and anode 606 of the MOS capacitor 624, and the polarization of the dielectric 618 by an applied electric field may increase the surface charge of the MOS capacitor 624 for a given electric field strength. The dielectric 618 can be native oxides of the cathode or the anode or both, or can be external dielectric materials such as high-k dielectrics or polymers which can be formed by deposition, oxidation, wafer bonding or other dielectric coating methods.

The cathode 604 may comprise negatively-doped silicon and the anode 606 may comprise positively-doped silicon. A cathode electrode 620 is disposed on the cathode 604 and an anode electrode 622 is disposed on the anode 606. When a voltage is applied between the electrodes, carrier accumulation, depletion or inversion can occur around dielectric 618. Due to the capacitor region overlapping with the optical waveguide, carrier concentration change may lead to changes in refractive index and propagation loss within waveguide 602. By biasing the voltage applied between the electrodes, the refractive index may be modulated accordingly, thereby inducing optical intensity modulation, phase shift modulation, and attenuation.

In a case where modulator 600 is implemented as phase-tuning mechanism 320, light may be evanescently coupled into the optical waveguide 602 (e.g., at least a portion of light propagating in waveguide 102 is transferred into the optical waveguide 602 as waveguide 302). In either implementation (e.g., as phase-tuning mechanism 308 or 320), light propagating through optical waveguide 602 is modulated, attenuated, and phase shifted based changes in the waveguide modal refractive index induced by biasing of the MOS capacitor 624. A portion of the modulated and attenuated light can evanescently couple from the optical waveguide 602 into another waveguide 605. The other waveguide 605 may be implemented as waveguide 302 (in the case of optical modulator 600 being implemented as phase-tuning mechanism 308), waveguide 102 (in the case of optical modulator 600 being implemented as phase-tuning mechanism 320), and/or bus waveguide 310.

For example, FIG. 6B includes a DC power source 626. The DC power source 626 acts as a signal source and has a negative terminal connected to the cathode electrode 620 and a positive terminal connected the anode electrode 622. This results in a migration of negative charges from the cathode 604 toward a side of the optical waveguide 602 adjacent to the cathode 604, and migration of positive charges ("holes") from the anode 606 to an opposite side of the waveguide 602 (also referred to herein as accumulation mode). In other examples the polarity of the DC power source 626 may be reversed. Reversing the polarity of the DC power source 626 causes a migration of negative charges from the waveguide 602 toward cathode electrode 620, and migration of holes from the waveguide 602 toward anode electrode 622 (also referred to herein as depletion mode).

The MOS capacitor 624 forms at the boundary between the Group III-V material of the cathode 604 and the underlying capacitor portion of the intrinsic silicon or other Group IV material. A thin layer of silicon and Group III-V oxides (e.g., dielectric 618) forms naturally at this boundary and serves as a dielectric for the capacitor. In some examples, this thin layer has a thickness on a nanoscale, for example, a few nanometers thick. In some examples, steps need not be taken to encourage the formation of dielectric 618. In other examples, the formation of dielectric 618 may be stimulated, for example by elevating the temperature, exposing the materials to an oxygen-rich atmosphere, or other suitable technique.

As discussed previously, the MOS capacitor 624 is formed inside the optical waveguide 602 so that charge carriers that accumulate/deplete on either side of the capacitor dielectric have the effect of changing the index of refraction of the optical waveguide and waveguide loss (e.g., loss or attenuation of propagated signal power in the waveform).

The MOS capacitor 624 can operate in accumulation, depletion or inversion mode (e.g., accumulation of electrons at the dielectric layer in addition to presence of holes). As discussed above, a DC voltage can be applied between an anode and cathode, causing a thin charge layer to accumulate, deplete, or invert on both sides of the dielectric layer 618. The resulting change in free carrier density causes a change in refractive index n of the optical waveguide 602, which is manifested as a change in the effective refractive index of the optical mode ($\Delta n_{eff}$). The amount of change or modulation in the effective refractive index ($\Delta n_{eff}$) and associated change in optical losses ($\Delta\alpha$) can be described with as follows:

$$\Delta n_{eff} = \frac{-q^2\lambda_0^2}{8\pi^2c^2n\varepsilon_0}\left(\frac{\Delta N_e}{m_{ce}^*} + \frac{\Delta N_h}{m_{ch}^*}\right) \quad \text{Eq. 14}$$

$$\Delta\alpha = \frac{-q^3\lambda_0^2}{4\pi^2c^3n\varepsilon_0}\left(\frac{\Delta N_e}{m_{ce}^{*2}\mu_e} + \frac{\Delta N_h}{m_{ch}^{*2}\mu_h}\right) \quad \text{Eq. 15}$$

Where q is electrical charge applied to the cathode 604 and the anode 606, c is the speed of light in vacuum, $\varepsilon_0$ is the permittivity of free space, n is the material refractive index, ΔN represents a change in carrier density such that $\Delta N_e$ represents the change in carrier density in terms of electrons that $\Delta N_h$ represents the change in carrier density in terms of holes, m* represents the relative effective mass of electrons ($m^*_{ce}$) and holes ($m^*_{ch}$), $\mu_h$ represents the hole mobility, $\mu_e$ represents the electron mobility, and $\lambda_0$ is the free space wavelength.

An optical phase shift ($\Delta\varphi$) at the end of the capacitor depends on the magnitude of the voltage-induced $\Delta n_{eff}$, the device length L, and the optical wavelength $\lambda$. In this example, the optical phase shift can be calculated as $\Delta\varphi=2\pi \Delta n_{eff} L\lambda$. Thus, the optical phase of the light within optical waveguide 602 may be shifted based on the voltage-induced $\Delta n_{eff}$. In various examples, the waveguide loss in silicon and Group III-V material may also change simultaneously as carrier density changes, and control of the change in the waveguide loss can be used as an optical attenuator. For example, changes in waveguide loss may be controlled based on the change in carrier density, which may impart attenuation of the waveguide losses. The attenuated waveguides losses can be used to modulate a signal.

As shown in FIG. 6A, the optical modulator 600 may be a ring resonator optical modulator. In this case, trench 612, shown in FIG. 6B, is provided as an annular trench that divides the optical modulator into first and second portions 614 and 616, respectively. Similarly, the anode 606 is provided as an annular-shaped anode in the second portion and the cathode 604, dielectric 618, and the silicon layer 610 are cylindrical in shape in the first portion. The MOS capacitor 624 is defined across a boundary between the cathode and the anode.

As described above, the depletion or accumulation of charges at the interfacial layer results in a change of free carrier density that changes the local refractive index of the waveguide 602. As described above, with reference to FIGS. 3 and 4, the change in the refractive index of waveguide 602 may be used to induce a phase shift (e.g., offset the phase) of light propagating in waveguide 602. When used as a phase-tuning mechanism 320, the phase shift based on a voltage bias to the MOSCAP 624 may be used to optimize and tune the conditions described above with reference to FIG. 5 so to amplify a side mode and generate output light having a wider bandwidth than under unity gain.

FIGS. 7-11 illustrate various additional example implementations of phase-tuning mechanism according to implementations of the present disclosure. As with FIGS. 6A and 6B, FIGS. 7-11 illustrate example hybrid MOS ring-resonator optical modulators that may be implemented as a phase-tuning mechanism, for example, phase-tuning mechanism 320 and/or phase-tuning mechanism 308 of FIG. 3.

FIGS. 7-11 provide examples that enhance the refractive index change and phase shift effects, for example, by improving optical phase shift induced by the MOS capacitor 624 by increasing the amount of change per applied voltage and/or decreasing an amount of time between applied voltage and induced change. Implementations disclosed herein combine the MOSCAP modulator of FIGS. 6A and 6B with a silicon device integrated into the optical waveguide that is configured to improve the efficiency of the optical phase shift by increasing changes in carrier concentration in the waveguide, for example, through integrating a resistor element, PIN junction diode, and/or a PN junction diode into the optical waveguide.

Figure 7:
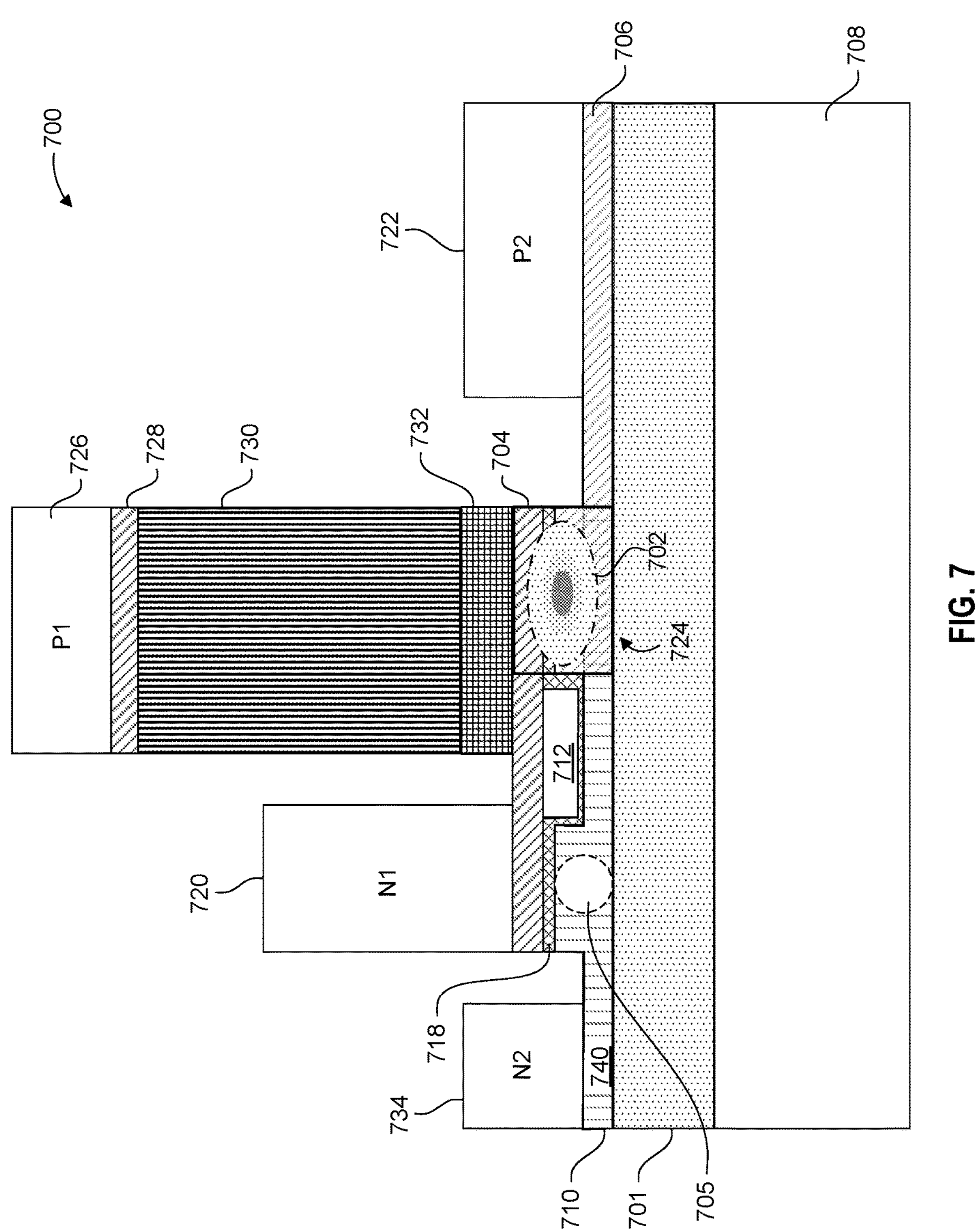
FIGS. 7-11 illustrate example phase-tuning mechanisms comprising a MOSCAP and a silicon device according implementations of the present disclosure.

FIG. 7 illustrates a MOS capacitor (MOSCAP) laser, and more particularly, as a micro laser including a hybrid MOS optical modulator 700. The optical modulator 700 may be a representation of a cross section of the optical modulator 800 of FIG. 8 taken along the line B-B'.

The optical modulator 700 includes an optical waveguide 702, a first cathode 704 comprising a first material and a portion of which is formed in the optical waveguide 702, and an anode 706 comprising a second material that is dissimilar from the first material and formed in the optical waveguide 702. The optical waveguide 702 may be an example implementation of waveguide 302 (or waveguide 102 in the case of phase-tuning mechanism 308). The anode 706 adjoins the cathode 704 within the waveguide 702. A capacitor 724 is defined between the anode 706 and the cathode 704.

In various examples, a buried oxide (BOX) layer 701 comprising oxide is grown on a substrate 708, for example, such as a silicon dioxide layer. Additionally, a silicon device layer 710 and the anode 706 are formed on the BOX layer 701. The cathode 704 is formed above the silicon device layer 710 opposite the BOX layer 701 and spans a trench 712 formed between the silicon device layer 740 and the capacitor 724. In various embodiments, the cathode 704 comprises a layer of Group III-V material as the first material, such as indium phosphide (In P), gallium arsenide (GaAS) or other compounds of indium, gallium, phosphorus, and arsenic. The cathode 704 may be formed by deposition, wafer bonding, monolithic growth, or other fabrication techniques. The anode 706 may comprise silicon or another Group IV material as the second material, for example, germanium, silicon carbide, silicon germanium, and so on. The capacitor 724 may be a MOSCAP defined between the cathode 704 and the anode 706.

A dielectric 718 (also referred to herein as an interfacial layer) is formed between the cathode 704 and the anode 702 and formed in the waveguide 702. The dielectric 718 can be native oxides of the cathode or the anode or both, or external dielectric materials such as high-k dielectrics or polymers which can be formed by deposition, oxidation, wafer bonding or other dielectric coating methods.

The MOSCAP 724 forms at the boundary between the first material of the cathode 704 and the underlying optical waveguide of semiconductor material (e.g., silicon or other Group IV material). A thin layer of silicon and III-V oxides (e.g., dielectric 718) forms at this boundary and serves as a dielectric for the capacitor. In some examples, the dielectric layer 718 may have a nanoscale thickness, for example, the dielectric layer 718 may be a few nanometers thick. In some examples, steps need not be taken to encourage the formation of dielectric 718. In other examples, the formation of dielectric 718 may be stimulated, for example by elevating the temperature, exposing the materials to an oxygen-rich atmosphere, or other suitable technique.

The cathode 704 may comprise negatively-doped silicon (e.g., a n-doped semiconductor layer) and the anode 706 may comprise positively-doped material (e.g., a p-doped semiconductor layer). In some implementations, the anode 706 comprises a heavy positively-doped material, for example, comprising carrier concentration (e.g., holes or electrons) that is larger than that of cathode 704. In an example, anode 706 may comprise a material doped to approximately 1e20 cm-3. In some examples, the silicon device layer 710 may comprise a heavily doped material, for example, the silicon device layer 710 may comprise a material doped to approximately 1e20 cm-3. A contact electrode 720 (also referred to as electrode 720) is disposed on the cathode 704 and a contact electrode 722 (also referred to as electrode 722) is disposed on the anode 706. When a voltage bias is applied to electrodes 720 and 722, carrier accumulation, depletion or inversion can occur around dielectric 718, as described in greater detail below. Due to the capacitor region overlapping with the optical waveguide, carrier concentration change may lead to changes in waveguide modal refractive index and propagation loss. By biasing the voltage applied between the electrodes 720 and 722, the refractive index may be modulated accordingly, thereby inducing optical intensity modulation, attenuation, and optical modal phase shift (e.g., shifting of wavelength carried by the waveguide 702).

Light propagated through optical waveguide 702 (e.g., orthogonal to the FIG. 7) is modulated, attenuated, and phase shifted based on changes in waveguide modal refractive index induced by biasing of the MOSCAP 724. A portion of the modulated and attenuated light can then evanescently couple from the optical waveguide 702 into another waveguide 705 via a channel between the trench 712 and BOX layer 701 and output from optical modulator 700 for use downstream. The other waveguide 705 may be implemented as waveguide 302 (in the case of optical modulator 600 being implemented as phase-tuning mechanism 308), waveguide 102 (in the case of optical modulator 600 being implemented as phase-tuning mechanism 320), and/or bus waveguide 310. The BOX layer 701 may be provided to confine the optical mode in a vertical direction (e.g., into the layers provided on the BOX layer 701).

As discussed above, the MOS capacitor is formed inside the optical waveguide 702 so that charge carriers that accumulate/deplete on either side of the capacitor dielectric have the effect of changing the index of refraction of the waveguide and changing propagation loss.

The MOS capacitor can operate in accumulation, depletion, or inversion mode. As discussed above, a DC voltage can be applied between anode 706 and cathode 704, causing a thin charge layer to accumulate, deplete, or invert on both sides of the dielectric layer 718. The resulting change in free carrier density causes a change in refractive index n of the waveguide 702, which is manifested as a change in the effective refractive index of the optical mode ($\Delta n_{eff}$). The amount of change or modulation in the effective refractive index ($\Delta n_{eff}$) and associated change in optical losses ($\Delta\alpha$) can be described with as set forth above in Eqs. 14 and 15. The voltage-induced $\Delta n_{eff}$ also causes an optical phase shift of light propagating in the optical waveguide 702, as discussed above, To enhance the change in effective refractive index and optical phase shift induced in the optical waveguide 702, the silicon device layer 710 is formed on the BOX layer 701 and in the waveguide 702. The silicon device layer 710 includes the anode 706 and a second cathode 740 comprising a third material formed in the waveguide 705. The third material may be a silicon or another Group IV material, which may be the same or different from that of the cathode 704. The second cathode 740 is also formed in the optical waveguide 702, thereby providing the channel through which a portion of light traversing the waveguide 702 can be tapped into the waveguide 705. The second cathode 740 is formed in the silicon device layer 710 and is overlapped with the trench 712.

As noted above, the change in modal effective refractive index and phase shift induced by voltage bias applied to the MOS capacitor may be small, and can be enhanced by the implementations disclosed with reference to FIGS. 7-11 through the use of silicon device layer 710. For example, optical modulator 700 may provide for improving phase tuning efficiency, which translates to wider wavelength shifts which may be used for direct high-speed modulation and/or alignment to resonator based modulators. For example, the second cathode 740 may comprise a doped material, which may be positively- or negatively-doped material (e.g., a n-doped semiconductor layer or a p-doped semiconductor layer) and the optical waveguide 702 may comprise intrinsically doped material or positively- and/or negatively-doped material (e.g., a n-doped semiconductor layer or a p-doped semiconductor layer). The second cathode 740 may be heavy doped material of either polarity (e.g., 710 may comprise a material doped to approximately 1e20 cm-3). A contact electrode 734 is disposed on the cathode 740. When a voltage bias is applied between the electrodes 734 and 722, enhancement of the carrier accumulation, depletion or inversion can occur within the optical waveguide 702 based on the doped materials of the silicon device layer 710, as described in greater detail below. Due to the silicon device layer 710 formed in the optical waveguide 702, carrier concentration change may enhance changes in waveguide modal refractive index and propagation loss induced by biasing the MOSCAP 724.

In various examples, the dielectric 718 is formed between the cathode 740 and the cathode 704. In the example shown in FIG. 7, the dielectric 718 is formed continuously from the cathode 704 to the optical waveguide 702 so as to overlap with the trench 712. In another example, the dielectric 718 may not be present within trench 712. In this case, two dielectrics 718 may be formed, a first dielectric between optical waveguide 702 and cathode 704 and a second between cathode 740 and the cathode 704.

Additionally, in some examples, the optical modulator 700 may include an optional light-emitting portion configured to generate light that is injected into the optical waveguide 702. The light generated by the light-emitting portion may be modulated based on biasing the MOSCAP 724 and the second cathode 740, and a portion of the modulated light may be tapped off (e.g., via evanescent coupling) into the waveguide 705. In a case that the light-emitting portion is not included in the optical modulator 700, light may be received from the waveguide 705 (e.g., as bus waveguide 310 in some examples) and tapped off into the optical waveguide 702, as described above. The tapped off light may then be modulated based on biasing the MOSCAP 724 and the second cathode 740 and then output into the waveguide 705 (e.g., as bus waveguide 310, waveguide 302, or waveguide 102 depending on the implementation).

The optional light-emitting portion may be an example of an optical amplification mechanism, such as optical amplification mechanism 104 and/or 304. Thus, in the example implementations of FIG. 7 including the light-emitting portion, the phase-tuning mechanism and optical amplification mechanism may be formed together and comprise shared structures as needed. The light-emitting portion may be implemented to generate light and/or provide optical gain/loss as described herein depending on the application.

The light-emitting portion may be a light-emitting diode, laser diode, and the like. In the illustrative example shown in FIG. 7, the optical modulator 700 includes an optical gain material 732 (or laser gain material in the case of a laser diode) formed on the cathode 704. The optical gain material 732 may comprise, for example, QD, QW, quantum-dash structures, or any structure that can create carrier population inversion for optical gain. A doped semiconductor layer 730 is formed between the optical gain material 732 and a highly doped semiconductor layer 728. The semiconductor layers 730 and 728 may comprise silicon or another Group IV material. In various examples disclosed herein, in the case of dopants added on the order of one dopant atom is added per 100 million atoms the material may be referred to as low or lightly doped. Whereas, in the case of many more dopant atoms are added, such as on the order of one per ten thousand atoms the material may be referred to as highly doped. In one illustrative example, semiconductor layer 730 may be doped between 5e17 and 5e18 $cm^{-3}$, semiconductor layer 730 may be doped between 5e17 and 5e18 $cm^{-3}$; silicon device layer 710 and anode 706 may be doped to approximately 1e20 $cm^{-3}$, and highly doped semiconductor layer 728 may be doped between 5e18 and 5e19 $cm^{-3}$.

The doped semiconductor layer 730 may comprise positively-doped silicon (e.g., a p-doped semiconductor layer) and the highly doped semiconductor layer 728 may comprise positively-doped silicon (e.g., a highly p-doped semiconductor layer). An electrode 726 may be formed on the highly doped semiconductor layer 728 opposite the doped semiconductor layer 730. When a voltage bias is applied between the electrodes 726 and 720, carrier concentration change leads to stimulated emission in the optical gain material 730, thereby generating light. Generated light traverses the layers and is received at the waveguide 702, which is then modulated according to biasing of the MOSCAP and silicon device layer 710. A portion of the modulated light is tapped into the waveguide 705 for use downstream. Control of the width of the trench 712 alters an amount of light from the optical waveguide 702 that is injected into the waveguide 705 (e.g., a larger width results in a smaller percentage of light injected into the waveguide).

Accordingly, by biasing the voltage applied between the electrodes 726 and 720, light emission is generated by the optical modulator 700 and injected into the optical waveguide 702. The light may then be modulated and attenuated by changing the refractive index of the optical waveguide 702 by biasing a voltage applied to the capacitor region, which may be enhanced by biasing the silicon device layer region. For example, employing phase shift and modulation though separate electrical contacts (e.g., applying voltage bias between electrode 720 and electrode 722, while simultaneously applying a bias between electrode 734 and electrode 722), implementations herein can obtain not only a non-return-to-zero (NRZ) modulation with larger optical modulation amplitude (OMA) with two synchronous NRZ electrical signals, but also a pulse amplitude modulation (e.g., PAM4) with two separate NRZ electrical signals. For example, independently biasing voltages applied to each pair of electrode contacts allows for separate modulation. As an illustrative example, the MOSCAP 724 and second cathode 740 may be independently biased so to induce varying modulations of phase shifting properties. Furthermore, biasing of the light-emitting portion may permit modulation of the amplitude of the output light along with the modulation of the phase shift. As an illustrative example, by biasing the voltage across electrodes 726 and 720 of the light-emitting portion to induce an amplitude modulation of the light (e.g., varying light intensity), while also biasing the MOSCAP 724 and second cathode 740 to induce a phase shift modulation.

While FIG. 7 illustrates the optical modulator 700 including the light-emitting portion, the implementations is not so limited. For example, the optical modulator 700 need not include the light-emitting portion and may receive light from an external source, for example, similar to the optical modulator 600 described above. As another example, the optical modulator 700 may receive light from an optical amplification mechanism coupled to the waveguide 702, such as optical amplification mechanism 204. Additionally, while certain materials are described as negatively- or positively-doped, implementations are not limited thereto, and the polarity doping may be switched. For example, while the above example described the cathode 704 as negatively-doped the anode 706, layer 730, and layer 728 as positively-doped, the polarity of each layer may be switched such that the cathode 704 is positively-doped and the anode 706, layer 730, and layer 728 may be negatively-doped.

Figure 8:
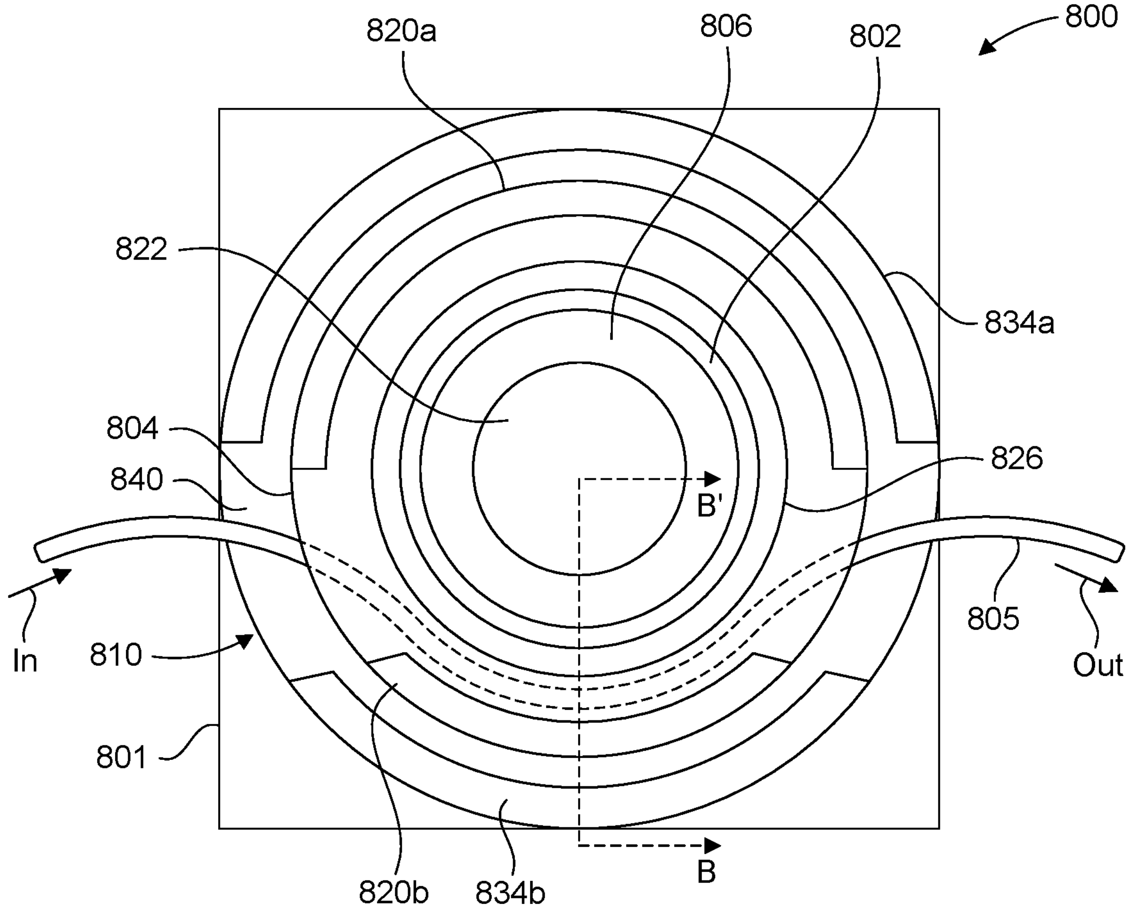

FIG. 8 illustrates a top-down view of an example optical modulator according to implementations disclosed herein. The optical modulator 800 of FIG. 8 illustrates a micro laser including a hybrid MOS optical modulator having a ring-shaped structure, for example, a micro-ring laser including a hybrid MOS optical modulator (generally referred to here as a MOSCAP micro-ring laser or simply a MOSCAP laser). In an illustrative example, optical modulator 800 is an example of optical modulator 700 comprising a ring or annular shaped structure when viewed from above. For example, optical modulator 700 of FIG. 7 may be a representation of a cross section of optical modulator 800 taken along the line B-B'. Accordingly, reference numbers in FIG. 8 may correspond to similar reference numbers in FIG. 7. For example, reference number 802 in FIG. 8 may correspond to optical waveguide 702 of FIG. 7, reference number 805 may correspond to waveguide 705, etc. As such, the elements and structures of FIG. 8 include properties and characteristics as described above in connection with FIG. 7, except as set forth herein with reference to FIG. 8.

Optical modulator 800 is formed on a BOX layer 801 and a silicon device layer 810 is formed thereon. An annular-shaped cathode 804 is formed on top of the silicon device layer 810 having a thin dielectric (e.g., similar to dielectric 718) therebetween (not shown) and spans a trench (not shown). The silicon device layer 810 is formed in waveguide 805 and optical waveguide 802. The silicon device layer 810 includes a cylindrical-shaped anode 806, an annular-shaped optical waveguide 802, and an annular-shaped cathode 840. The cylindrical-shaped anode 806, having an electrode 822 formed thereon, is encircled by the annular-shaped optical waveguide 802 and annular-shaped cathode 840. The waveguide 805 is formed in the cathode 840. An MOS capacitor is defined between the cathode 804 and the anode 806 using the dielectric formed between the cathode 804 and anode 806.

In the illustrative example of FIG. 8, a cylindrically-shaped electrode 822 is formed on the anode 806; electrodes 820*a* and 820*b* (collectively electrodes 820) are formed on the cathode 804; and electrodes 834*a* and 834*b* (collectively electrodes 834) are formed on the cathode 840. The cathode 804 may have electrode 820*a*, electrode 820*b*, or both as desired. Each electrode 820 may be partially annular-shaped and may partially encircle the anode 806. In another example, the electrodes 820 may be integrated as a single electrode 820 having an annular-shape that encircles the anode 806. Similarly, the cathode 840 may have electrode 834*a*, electrode 834*b*, or both as desired. Each electrode 834 may be partially annular-shaped and may partially encircle the anode 806. In another example, the electrodes 834 may be integrated as a single electrode 834 having an annular-shape that encircles the anode 806.

Additionally, similar to optical modulator 700, optical modulator 800 includes a light emitting portion formed of an annular-shaped optical gain material underlying electrode 826 that encircles the anode 806. A doped semiconductor layer is formed between the optical gain material and a highly doped semiconductor layer, which underlies the electrode 826 as described in connection with FIG. 7.

In operation, light propagates in the optical waveguide 802 in a circular direction around the ring-shaped resonator. A portion of the light is then tapped out of the optical waveguide 802 into the waveguide 805, which is then output to downstream devices.

As alluded to above, the modulation and attenuation due to biasing the voltage applied to the capacitor region may be enhanced by the inclusion of the silicon device layer as set forth herein (e.g., silicon device layer 710 and/or 810) formed in an optical waveguide (e.g., waveguide 702 and/or 802). More particularly, a silicon device layer according to implementations herein may be doped so as to induce change in carrier concentration in the waveguide in response to voltages applied. For example, with reference to FIG. 7, the silicon device layer 710 may comprise a heavy positively-doped material (e.g., silicon or the like) integrating a resistor element into the optical waveguide 702 (or 802). As another example, the silicon device layer 710 may comprise heavy negatively-doped material (e.g., silicon or the like) integrating a positive-intrinsic-negative (PIN) junction diode element into the optical waveguide 702 (or 802), where the optical waveguide is an intrinsically doped region. In yet another example, the silicon device layer 710 may comprise a first region of a heavy negatively-doped material (e.g., silicon or the like) and a second region of a negatively-doped material (e.g., silicon or the like) integrating a positive-negative (PN) junction diode element into the optical waveguide 702 (or 802). Further details regarding each implementation are provided below with reference to FIGS. 9-11.

Figure 9:
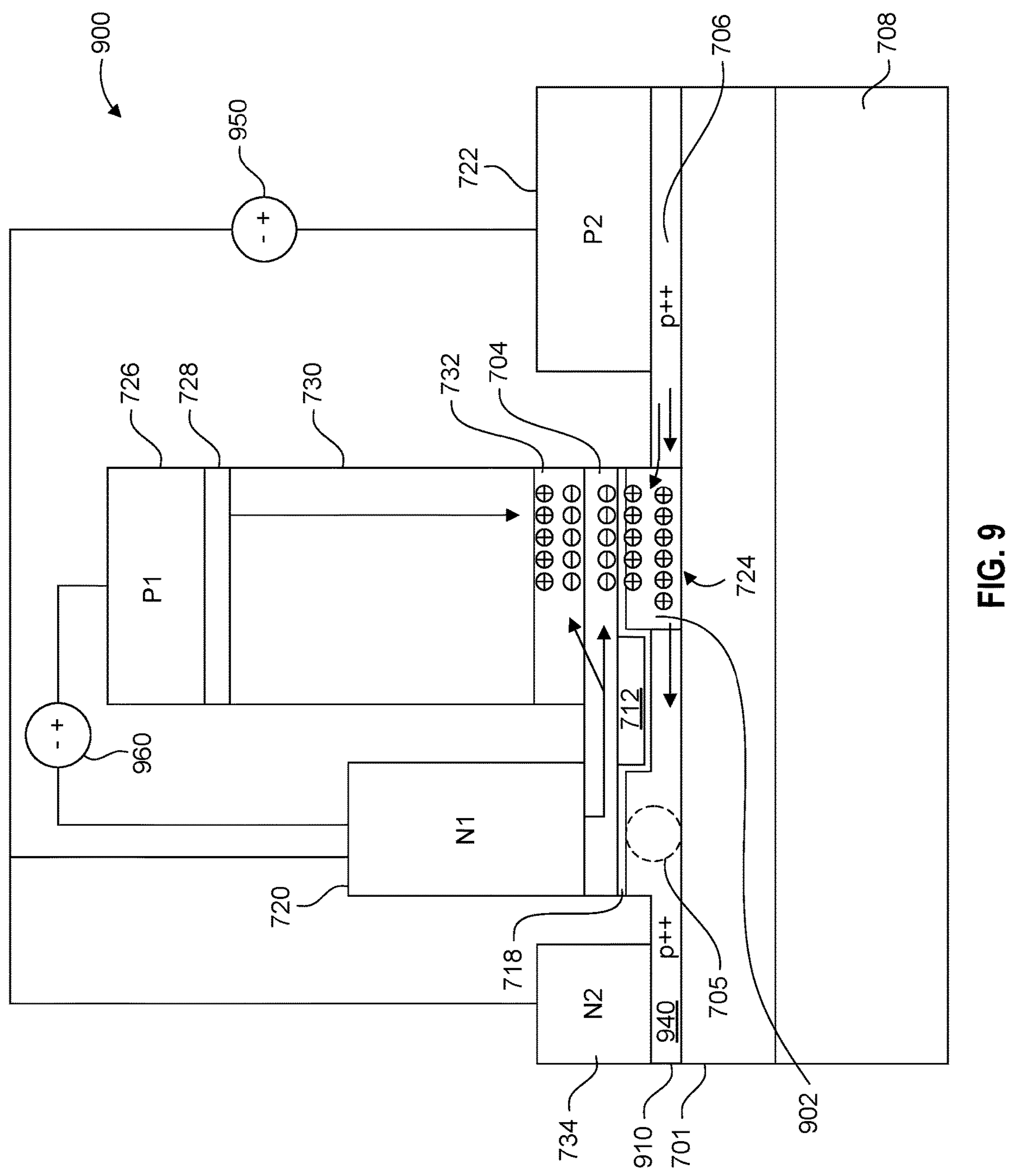

FIG. 9 illustrates an example optical modulator 900 according to an implementation disclosed herein. FIG. 9 shows an optical modulator 900 that is similar to, or the same as, the optical modulator 700 of FIG. 7 and/or optical modulator 800 of FIG. 8, such that like reference numbers in FIG. 9 represent the same elements from FIG. 7. Thus, as with optical modulators 700 and 800, optical modulator 900 includes a capacitor region and an optical light-emitting portion as set forth above in connection with FIGS. 7 and 8.

Additionally, optical modulator 900 includes a silicon device layer 910 that is similar to the silicon device layer 710 of optical modulator 700, except that the optical waveguide 902 is integrated with a resistor element. For example, the silicon device layer 910 may be substantially similar to the silicon device layer 710 of FIG. 7, except that the cathode 940 comprises a heavy positively-doped material, such as silicon or other Group IV material. Additionally, the waveguide 902 includes an intrinsically doped material (e.g., silicon or other Group IV) between and in contact with the cathode 940 and the anode 706. In this implementation, as noted above, the anode 706 comprises a heavy positively-doped material. Accordingly, changes in carrier concentration in the waveguide 902 results in a highly resistive region that generates heat based on a flow of charges passing between the highly doped contacts to the waveguide 902. Thus, a resistor element is integrated into the waveguide 902.

In the illustrative example shown in FIG. 9, a power source 950 is electrically coupled between electrodes 722 and 720 and between electrodes 722 and 734. The power source 950 may be a DC power source having a negative terminal connected to the electrodes 720 and 734 and a positive terminal connected the electrode 722. The power source 950 may be controlled, for example, by a controller (e.g., implemented as a computer system described in FIG. 15) to apply voltage bias between the respective electrodes. That is, a bias may be applied between electrode 722 and 734 simultaneously with a bias applied between electrodes 722 and 720. While the example shown in FIG. 9 provides a single power source 950, a plurality of power sources may be used in place of power source 950. For example, a first power source may be used to apply a first voltage bias across electrodes 722 and 720 and a second power source may be used to apply a second voltage bias across electrodes 722 and 734. As such, voltage bias may be independently controlled across respective electrodes simultaneously.

When a voltage is applied between the electrodes 722 and 720 according to the example shown in FIG. 9 (e.g., power source 950), negative charge and holes accumulate around the interfacial layer 718. For example, as shown in FIG. 9, negative charges from the cathode 704 migrate to toward the waveguide 902, and holes (positive charges) migrate from the anode 706 to the waveguide 902. The accumulation of charge and change in carrier concentration cause changes in the waveguide refractive index and propagation loss, as described above.

When a voltage is applied between the electrodes 734 and 722 according to the example shown in FIG. 9, positive charge passes through the optical modulator thereby generating heat in the waveguide 902. For example, as shown in FIG. 9, holes (e.g., positive charges) migrate from the highly positively-doped anode 706 to the intrinsically doped waveguide 902. The flow of charge in the waveguide 902 leads to a resistive region that generates heat. The generation of heat increases the waveguide effective refractive index of the mode as follows:

$$-\nabla\cdot(k\nabla T)=Q \quad \text{Eq. 16}$$

Where the thermal effect is modeled by the steady-state heat equation (Poisson's equation) shown as Eq. 16. k is the coefficient of heat conduction, Q is the total charge (e.g., carrier concentration) of the heat source, and T is the temperature. The thermal effect may be numerically simulated for a certain structure. Once the gradient of Tis obtained, a material's thermo-optic coefficient (dn/dT) may be used to calculate the change in refractive index which is defined by dn.

Accordingly, the change in the effective refractive index may be enhanced through generation of heat in the waveguide 902 from the integrated resistor element. For example, increased temperature can induce additional and quicker change in the effective refractive index in concert with along with the change in refractive index induced by biasing the voltage applied to the capacitor region.

In another example the polarity of the power source 950 may be reversed. Reversing the polarity of the power source causes a migration of negative charges from the waveguide 902 toward electrode 720, and migration of holes from the waveguide 902 toward electrode 722. Similarly, reversing the polarity of the power source causes a migration of holes charges from the waveguide 902 toward electrode 722, thereby reducing the resistive characteristics and decreasing temperature.

Furthermore, the optical phase ($\Delta\varphi$) is also changed based on the change in temperature as described in Eq. 13 above. For example, where $L_H$ a thermal length of the waveguide 902, dn/dT is a thermos-optic coefficient dependent on the material from which the waveguide 902 is formed (e.g., indicative of a change in refractive index with the response to temperature), $\Delta T$ is the change in temperature of the waveguide 902, and $\lambda_0$ is the free space wavelength. Thus, biasing the electrodes 734 and 722 improves the phase shift of the optical mode in the waveguide 702 by enhancing the changes induced by the MOSCAP 724.

Furthermore, with respect to the optional light-emitting portion, when a voltage is applied between the electrodes

726 and 720 according to the example shown in FIG. 9 (e.g., via power source 960), negative charge and holes accumulate in the optical gain material 732, thereby function as a pumping source. For example, as shown in FIG. 9, a negative terminal of power source 960 (which may be a DC power source) may be connected to the electrode 720 and a positive terminal connected the electrode 726. Accordingly, negative charges from the cathode 704 migrate to the optical gain material 732, and holes (positive charges) migrate from the highly doped semiconductor layer 728 through the doped semiconductor layer 730 to the optical gain material 732. The accumulation of charge and holes provides energy transition states to generate stimulated emissions resulting in optical gain, from which light may be emitted. Emitted light propagates through the cathode 704 into the waveguide 902. A portion of the light in the waveguide 902 can then be tapped out of the waveguide 902 into the waveguide 705 via a channel between the trench 712 and BOX layer 701. The light may be modulated according to voltage bias applied to the electrodes as set forth above.

One non-limiting advantage provided by the optical modulator 900 is that, since the waveguide 902 is intrinsically doped, the optical loss is kept low, albeit with increase heating underneath the laser structure which can possibly reduce overall-wall-plug efficiency.

Figure 10:
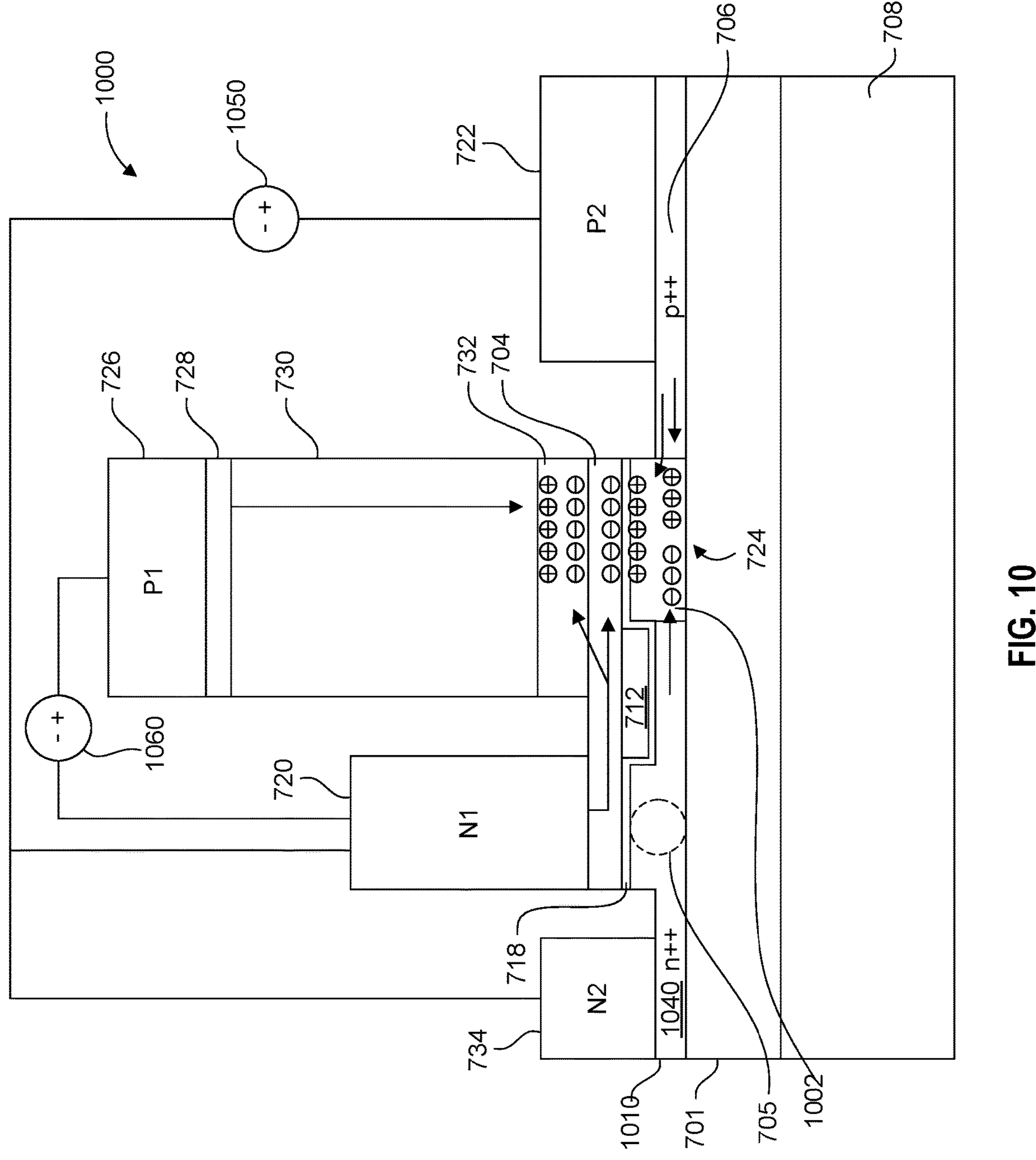

FIG. 10 illustrates an example optical modulator 1000 according to an implementation disclosed herein. FIG. 10 shows an optical modulator 1000 that is similar to the optical modulator 700 of FIG. 7 and/or optical modulator 800 of FIG. 8, such that like reference numbers in FIG. 10 represent the same elements from FIG. 7. Thus, as with optical modulators 700 and 800, optical modulator 1000 includes a capacitor region and an optical light-emitting portion as set forth above in connection with FIGS. 7 and 8.

Additionally, optical modulator 1000 includes a silicon device layer 1010 that is similar to the silicon device layer 710 of optical modulator 700, except that the optical waveguide 1002, which is similar to waveguide 702, is integrated with a PIN junction diode element. For example, the silicon device layer 1010 may be substantially similar to the silicon device layer 710 of FIG. 7, except that cathode 1040 comprises a heavy negatively-doped material, such as silicon or other Group IV material. Additionally, the optical waveguide 1002 is an intrinsically doped semiconductor material (e.g., silicon or other Group IV material) between and in contact with the cathode 1040 and the anode 706. In this implementation, as noted above, the anode 706 comprises a heavy positively-doped material. Accordingly, the combination of the cathode 1040, intrinsically doped waveguide 1002, and anode 706 function as a PIN junction diode and may inject carriers and holes into the waveguide 1002. The injection of carriers and holes may also induce a change in temperature (e.g., increased heat).

As with FIG. 9 above, a power source 1050 is electrically coupled between electrodes 722 and 720 and between electrodes 722 and 734. The power source 1050 may be a DC power source having a negative terminal connected to the electrodes 720 and 734 and a positive terminal connected the electrode 722. The power source 1050 may be controlled, for example, by a controller (e.g., implemented as a computer system described in FIG. 15) to apply voltage bias between the respective electrodes. That is, a bias may be applied between electrode 722 and 734 simultaneously with a bias applied between electrodes 722 and 720. While the example shown in FIG. provides a single power source 1050, a plurality of power sources may be used in place of power source 1050. For example, a first power source may be used to apply a first voltage bias across electrodes 722 and 720 and a second power source may be used to apply a second voltage bias across electrodes 722 and 734. As such, voltage bias may be independently controlled across respective electrodes simultaneously.

Similar to optical modulator 900 of FIG. 9 above, when a voltage is applied between the electrodes 722 and 720 according to the example shown in FIG. 10, negative charge and holes accumulate around the interfacial layer 718. The accumulation of charge and change in carrier concentration leads to changes in the waveguide refractive index and propagation loss, as described above.

When a voltage is applied between the electrodes 734 and 722 according to the example shown in FIG. 10, positive charges and negative charges accumulate in the optical waveguide 1002. For example, as shown in FIG. 10, negative charges from the cathode 1040 migrate to the optical waveguide 1002, and holes (positive charges) migrate from the anode 706 to the optical waveguide 1002. The change of carrier concertation and distribution in the silicon device layer 1010 leads to additional changes in waveguide modal refractive index and propagation loss. For example, the refractive index change is a result of a plasma dispersion effect in the waveguide 1002. The amount of change can be determined by experimental results, as shown below for a waveguide formed of silicon:

$$\Delta n(@\lambda_0 = 1210\text{ nm}) = -2.98\times 10^{-22}\times\Delta N^{1.016} - 1.25\times 10^{-18}\times\Delta P^{0.835} \quad \text{Eq. 17}$$

$$\Delta n(@\lambda_0 = 1550\text{ nm}) = -5.4\times 10^{-22}\times\Delta N^{1.011} - 1.53\times 10^{-18}\times\Delta P^{0.838} \quad \text{Eq. 18}$$

where $\Delta n$ is the change of refractive index, $\Delta N$ and $\Delta P$ are change of free electron (e.g., negative charge) and hole (e.g., positive charge) densities, respectively. Eq. 17 and Eq. 18 illustrate that hole accumulation enable a larger refractive shift than electron accumulation. Accordingly, one approach to improve the phase shift efficiency is through increased accumulation of holes inside the waveguide 1002 by using example of FIG. 10. Another approach to improve phase shift efficient is by increasing total free carrier densities inside the waveguide 1002; however, this could lead to increased optical loss due to free carrier absorption.

Furthermore, the accumulation of carriers and holes in the waveguide 1002 may induce an increase in temperature (e.g., generating heat). As described above in connection with FIG. 9, heat generation may enhance the refractive index change and phase shift efficiency.

In another example the polarity of the power source 1050 may be reversed. Reversing the polarity of the power source causes a migration of negative charges from the waveguide 1002 toward electrode 720, and migration of holes from the waveguide 1002 toward electrode 722. Similarly, reversing the polarity of the power source causes a migration of holes from the waveguide 1002 toward electrode 722 and migration of electrons from the waveguide 1002 toward electrode 734.

Additionally, the optional light-emitting portion of FIG. 10 functions as described above in connection with FIG. 8. For example, when a voltage (e.g., via power source 1060) is applied between the electrodes 726 and 720 according to the example shown in FIG. 10, negative charge and holes accumulate in the optical gain material 732, thereby function as a pumping source from which light may be emitted and propagate into the waveguide 1002.

Figure 11:
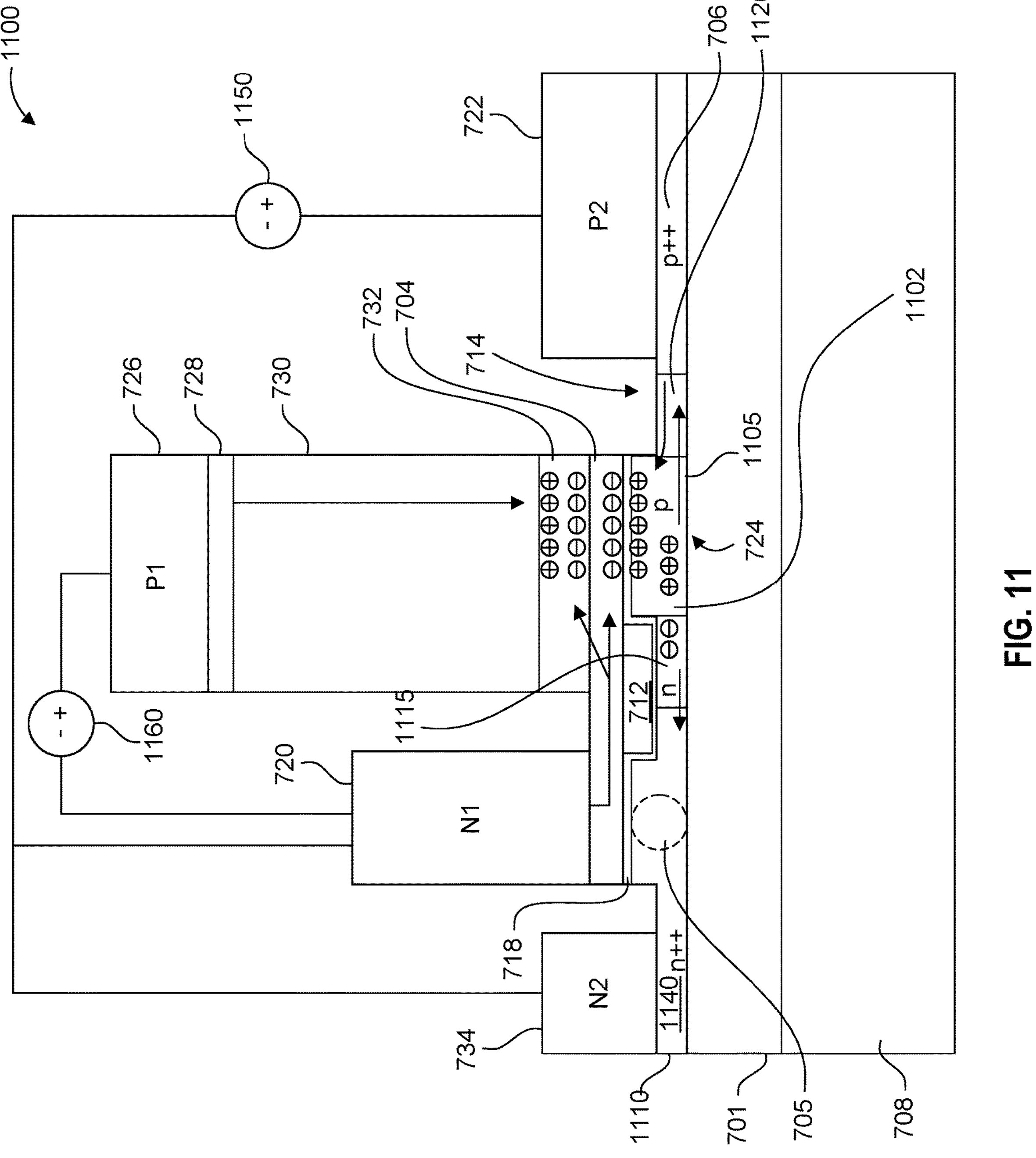

FIG. 11 illustrates an example optical modulator 1100 according to an implementation disclosed herein. FIG. 11 shows an optical modulator 1100 that is similar to the optical modulator 700 of FIG. 7 and/or optical modulator 800 of FIG. 8, such that reference numbers in FIG. 11 represent the same elements from FIG. 7. Thus, as with optical modulators 700 and 800, optical modulator 1100 includes a capacitor region and an optical light-emitting portion as set forth above in connection with FIGS. 7 and 8.

Additionally, optical modulator 1100 includes a silicon device layer 1110 that is similar to the silicon device layer 710 of optical modulator 700, except that the optical waveguide 1102, which is similar to waveguide 702, is integrated with a PN junction diode element. For example, the silicon device layer 1110 may be similar to the silicon device layer 1010 of FIG. 10, for example, the cathode 1140 is a heavy negatively-doped material and the anode 706 is a heavy positively-doped material. However, in the example of FIG. 11, the waveguide 1102 comprises a first region 1105 comprising a positively-doped material (e.g., such as silicon or other Group IV material) and a second region 1115 comprising a negatively-doped material (e.g., such as silicon or other Group IV material). Further still, a third region 1120 is disposed between the anode 706 and the waveguide 1102 that comprises a light positively-doped material. As used herein, heavily doped and lightly doped refer to doping concentrations in relation to a doped material. That is, a heavily doped material comprises a doping concentration (e.g., carrier concertation, either holes or electrons, dependent on whether the doping is p-type or n-type, respectively) that is greater than a doped material, while a lightly doped material comprises a doping concentration that is less than that of a doped material. As an example, as described above, lightly doped may refer to the case of dopants added on the order of one dopant atom is added per 100 million atoms, while heavily doped may refer to the case of many more dopant atoms added, such as on the order of one per ten thousand atoms the material. Accordingly, the waveguide 1102 is similar to waveguide 702 integrated with a PN junction diode that may change the carrier concentration in the waveguide 1102. The change the carrier concentration may also induce a change in temperature (e.g., increased heat).

Similar to the preceding examples, a power source 1150 is electrically coupled between electrodes 722 and 720 and between electrodes 722 and 734. The power source 1150 may be a DC power source having a negative terminal connected to the electrodes 720 and 734 and a positive terminal connected the electrode 722. The power source 1150 may be controlled, for example, by a controller (e.g., implemented as a computer system described in FIG. 15) to apply voltage bias between the respective electrodes. That is, a bias may be applied between electrode 722 and 734 simultaneously with a bias applied between electrodes 722 and 720. While the example shown in FIG. 11 provides a single power source 1150, a plurality of power sources may be used in place of power source 1150. For example, a first power source may be used to apply a first voltage bias across electrodes 722 and 720 and a second power source may be used to apply a second voltage bias across electrodes 722 and 734. As such, voltage bias may be independently controlled across respective electrodes simultaneously.

Similar to the preceding examples, when a voltage is applied between the electrodes 722 and 720 according to the example shown in FIG. 11, negative charge and holes accumulate around the interfacial layer 718. The accumulation of charge and change in carrier concentration leads to changes in the waveguide refractive index and propagation loss, as described above.

When a voltage is applied between the electrodes 734 and 722 according to the example shown in FIG. 11, positive charge and negative charge distribution changes in the optical waveguide 1102. For example, as shown in FIG. 11, negative charges from the second region 1115 migrate out to the cathode 840, and holes (positive charges) migrate from the first region 1105 to the anode 706. The change of carrier concertation and distribution in the waveguide 1102 leads to additional changes in waveguide modal refractive index and propagation loss. For example, the refractive index change is a result of a plasma dispersion effect in the waveguide 1102. The amount of change can be determined by the experimental results of Eqs. 17 and 18, as shown above.

As shown in Eqs. 17 and 18, holes provide for a larger refractive shift than electrons. Therefore, one way to improve the phase shift efficiency is by including more holes inside the waveguide 1102 by using the offset the PN junction design of FIG. 11. A second way is by increasing total free carrier densities inside the optical waveguide 1102, with a tradeoff in optical loss due to free carrier absorption. One method of addressing the optical loss is by utilizing different junction shapes. For example, L-shape and U-shape PN junctions may improve the overlap between carrier change area and optical mode so to improve phase shift efficiency.

In another example the polarity of the power source 1150 may be reversed. Reversing the polarity of the power source causes a migration of negative charges from the waveguide 1102 toward electrode 720, and migration of holes from the waveguide 1102 toward electrode 722. Similarly, reversing the polarity of the power source causes a migration of holes from the electrode 722 toward the first region 1105 and migration of electrons from electrode 734 toward the second region 1115.

Additionally, the optional light-emitting region of FIG. 11 functions as described above in connection with FIG. 8. For example, when a voltage (e.g., via power source 1160) is applied between the electrodes 726 and 720 according to the example shown in FIG. 11, negative charge and holes accumulate in the optical gain material 732, thereby function as a pumping source from which light may be emitted and propagate into the waveguide 1002.

While FIGS. 9-11 illustrate optical modulators including a light-emitting portion, the present disclosure is not so limited. For example, the optical modulators described above need not include the light-emitting portion and may receive light from an external source, for example, similar to the optical modulator 1100 described above. Furthermore, the optical modulators described above need not include a silicon device layer (e.g., silicon device layer 710, 810, 910, 1010, or 1100). For example, the optical modulates described above may include the MOSCAPs (e.g., MOSCAP 724) alone, such as described in connection with FIGS. 6A and 6B, or in combination with the optional light-emitting component. For example, optical modulator 600 of FIGS. 6A and 6B may include the optional light emitting component and/or be comprised in a resonator structure that includes an optical amplification mechanism (e.g., optical amplification mechanism 204).

Additionally, while the various materials are described as negatively- or positively-doped, implementations herein are not limited thereto, and the polarity doping may be switched. For example, while the above example described the cathode 704 as negatively-doped the anode 706, layer 730, and layer 728 as positively-doped, the polarity of each layer may be switched such that the cathode 704 is positively-doped and the anode 706, layer 730, and layer 728 may be negatively-doped. Similarly, in the case that the doping polarity is switched, the polarity of the doping of the second cathode (e.g., cathodes 940, 1040, and 1140) and the optical waveguide (e.g., optical waveguides 902, 1002, and 1102) are also switched.

Additional details regarding the devices described with reference to FIGS. 6-11 are provided in U.S. application Ser. No. 17/695,673, the disclosure of which is incorporated by reference in its entirety.

Figure 12:
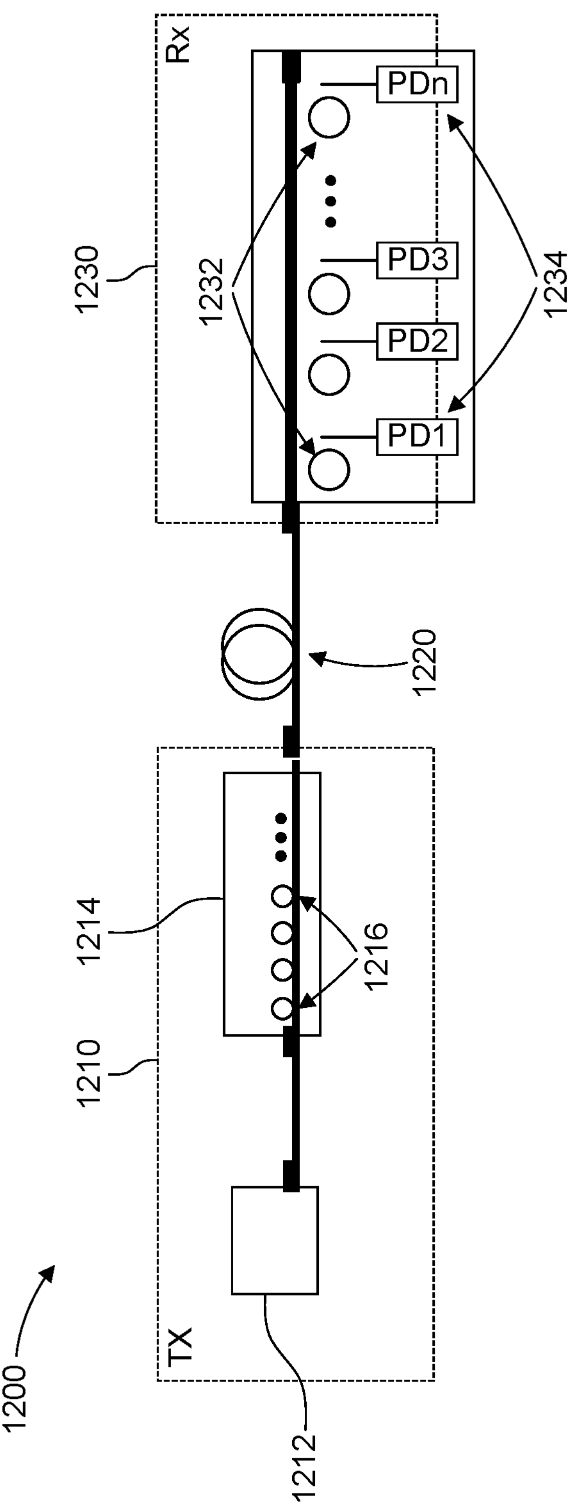
FIG. 12 is a schematic diagram of an example dense wavelength-division multiplexing (DWDM) silicon photonics optical system.

FIG. 12 is a schematic diagram of an example DWDM silicon photonics optical system 1200. The DWDM system 1200 can include DWDM photonic interconnects based on silicon photonics. In general, system 1200 includes an optical link 1220 that is physically coupling an optical transmitter module (Tx) 1210 for transmitting information modulated onto optical signals that are received by an optical receiver module (Rx) 630. The optical transmitter 1210 further includes several components for transmitting an optical signal, such one or more optical modulators 1216 aligned in series. The one or more optical modulators 1216 may be provided as, for example, the multiplexer 100 of FIG. 1 and/or multiplexer 300 of FIG. 3. In some implementations, the one or more optical modulators 1216 may each be configured for self-seeding light generation and therefore are configured to generate, resonate and emit light. In some implementations, the one or more modulators 1216 may be configured of injection locking based an external optical source 1212, such as a multi-length light source, illustratively provided as a comb laser. The one or more modulators may comprise both self-seeding multiplexers and external source-based injection locking multiplexers, as desired. The optical receiver module 1230 is shown to include several components for receiving an optical signal, such as optical filters, illustratively shown as micro-ring resonator filters 1232, and photodetectors 1234.

DWDM technology is widely used in fiber-optic telecommunications to increase the system capacity (e.g., without replacing existing backbone optic network). The optical transmitter module 1210 in the DWDM system 1200 uses a multi-wavelength light source. The optical transmitter module 1210 can multiplex N independent data streams, serialize them, and modulate them onto N different wavelengths λ1 . . . λN of light, typically having 50 GhZ-100 GHz of channel spacing. These data streams generated by the optical transmitter module 1210 can then be sent together and propagated through optical link 1220, such as an optical fiber, for a long distance (e.g., kilometers).

Subsequently, at the optical receiver module 1230 optical filters can be tuned for the N corresponding wavelengths. As seen in FIG. 12, the optical filters can be implemented as multiple micro-ring resonators filters 1232. A compact and scalable DWDM photonic link can be implemented by using cascading silicon micro-ring resonators to implement the modulator 1214 (at the Tx-end) and the filters 1232 (at the Rx-end) with slightly different radii to a single waveguide. In addition, the optical receiver module 1230 includes a series of photodetectors 1234, where each photodetector 1234 is correspondingly connected to a respective optical filter. As an example, SiGe APDs can be used as photodetectors 1234 due to the semiconductor-based implementation of the optical modulators 616. The micro-ring resonator filters 1232 and the photodetectors 1234 can serve as the de-multiplexer and de-serializer to convert the multi-wavelength serialized optical signals back to N independent electrical data streams simultaneously. It should be appreciated that the DWDM system 1200 shown in FIG. 12 can be either an interchip or an intrachip optical link.

In order to realize chip-scale DWDM nanophotonic interconnects for the system 1200, the use of micro-ring resonators offers multiple advantages, such as a small footprint (e.g., 10 μm in diameter) and low driving power. As shown in FIG. 12, micro-ring resonators can be configured to implement both the optical modulator 1214 at the Tx-side 1210 and the optical filter 1232 at the Rx-side 1230. However, laser based light sources generate light having a narrow linewidth which negatively impacts the data transmission rates. Wider bandwidths of light emitted from the Tx-side 1210 may be used to increase transmission rates. Thus, for example, the multiplexers disclosed herein may be implemented as the optical modulators 1216 to enhance (e.g., widen) the bandwidth for transmitting information modulated onto optical signals provided to the optical link 1202. Consequently, by using multiplexers disclosed herein in the DWDM system 1200, the footprint of the modulator 1214 may be reduced while providing an increased bandwidth to facilitate high data transmission rates.

FIG. 13 illustrates an example implementation of a single mode filter that may be included in the optical multiplexer according to implementations disclosed herein. FIG. 13 depicts a resonator structure 1310, which may be an example of resonator structure 101 described herein. Additionally, a bus waveguide 1320 is optically coupled to the resonator structure 1310 via an optical coupler 1325. The bus waveguide 1320 may be an example of bus waveguide 110. The optical coupler 1325 may be substantially similar to optical coupler 112 of FIG. 1, and implemented to evanescently couple light in the resonator structure 1310 into and from the bus waveguide 1320.

FIG. 13 depicts a configuration 1300 where a Mach Zehnder interferometer (MZI) 1340 is incorporated into the resonator structure 1310 to provide filtering so that only one lasing mode exists. The MZI 1340 comprises waveguide 1346 that is optically coupled to the resonator structure 1310 at two points via optical couplers 1342 and 1344. The optical couplers 1342 and 1344 may be, for example, but not limited to, a directional coupler, or the like. Light propagating in the resonator structure 1310 couples into the waveguide 1346 and is reflected via reflector R5 and then couples back into the resonator structure 1310. Due to differences in travel lengths and destructive interference upon coupling back into the resonator structure 1310, only one lasing mode will exist while other lasing modes are negligible due to the interference. Accordingly, the MZI 1340 operates to force a single mode operation of the resonator structure 1310.

Figure 14:
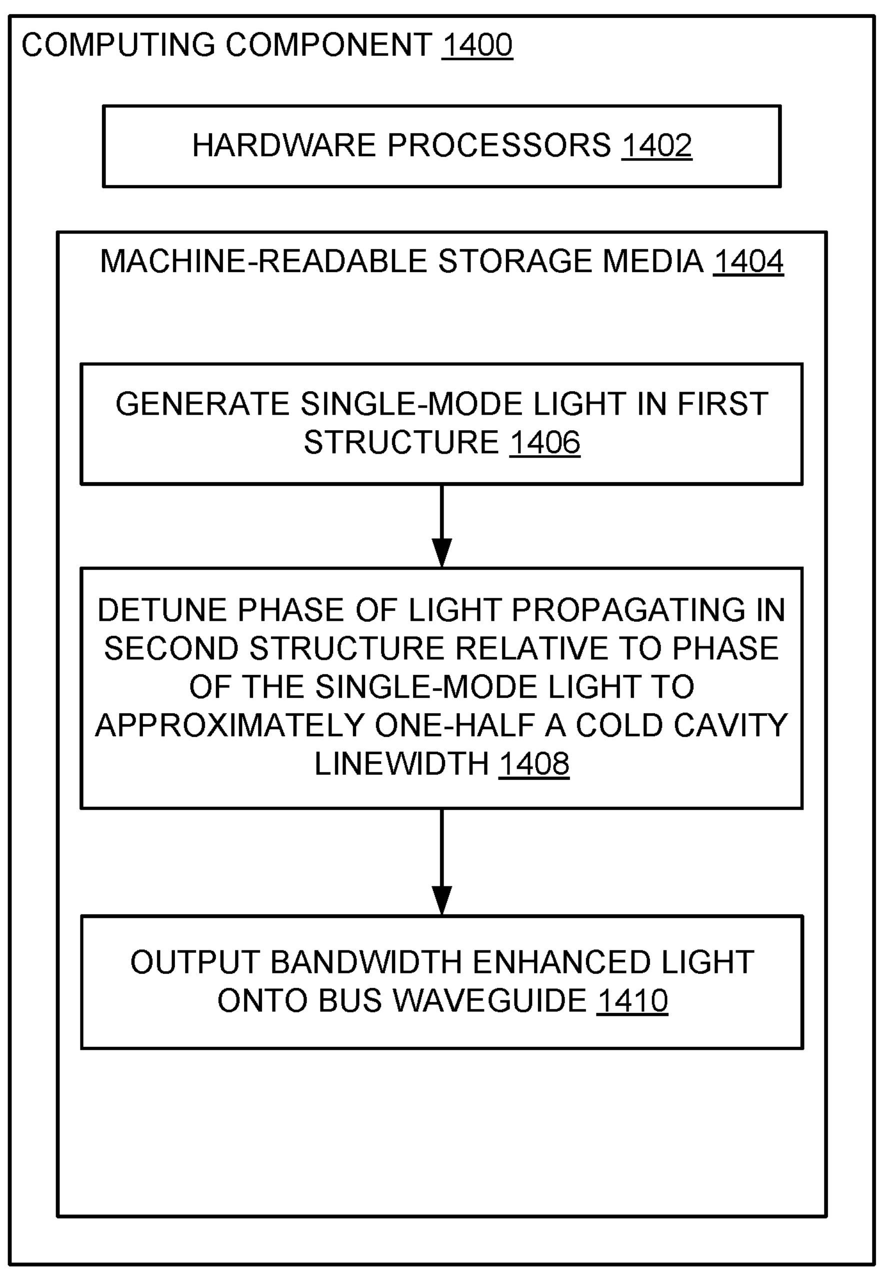
FIG. 14 is an example computing component that may be used to implement various features of an optical multiplexer in accordance with the implementations disclosed herein.

FIG. 14 illustrates an example computing component that may be used to implement an optical multiplexer in accordance with implementations disclosed herein. FIG. 14 illustrates a computing component 1400 that may be, for example, a server computer, a controller, or any other similar computing component capable of processing data. In the example implementation of FIG. 14, the computing component 1400 includes a hardware processor 1402, and machine-readable storage medium for 1404.

Hardware processor 1402 may be one or more central processing units (CPUs), semiconductor-based microprocessors, and/or other hardware devices suitable for retrieval and execution of instructions stored in machine-readable storage medium 1404. Hardware processor 1402 may fetch, decode, and execute instructions, such as instructions 1406-1410, to control processes or operations of the optical multiplexer, such as multiplexer 100 and/or 300 of FIGS. 1 and 3, respectively. As an alternative or in addition to retrieving and executing instructions, hardware processor 1402 may include one or more electronic circuits that include electronic components for performing the functionality of one or more instructions, such as a field programmable gate array (FPGA), application specific integrated circuit (ASIC), or other electronic circuits.

A machine-readable storage medium, such as machine-readable storage medium 1404, may be any electronic, magnetic, optical, or other physical storage device that contains or stores executable instructions. Thus, machine-readable storage medium 1404 may be, for example, Random Access Memory (RAM), non-volatile RAM (NVRAM), an Electrically Erasable Programmable Read-Only Memory (EEPROM), a storage device, an optical disc, and the like. In some embodiments, machine-readable storage medium 1404 may be a non-transitory storage medium, where the term "non-transitory" does not encompass transitory propagating signals. As described in detail below, machine-readable storage medium 1404 may be encoded with executable instructions, for example, instructions 1406-1410.

Hardware processor 1402 may execute instruction 1406 to generate single-mode light in a first structure. For example, first structure may be first resonator structure 101 of FIG. 3, which includes a single mode filter 106 and optical amplification mechanism 104. As described above, optical amplification mechanism 104 may function to provide optical gain to light propagating in the first resonator structure 101. In some embodiments, the optical amplification mechanism 104 generates light through self-seeding based on a voltage bias applied thereto. The single mode filter 106 forces the light propagating in the first resonator structure 101 to single mode operation. Under unity gain conditions, the single mode operation is a lasing mode.

Hardware processor 1402 may execute instruction 1408 to detune a phase of light propagating in a second structure relative to a phase of the single-mode light in the first structure to approximately one-half a cold cavity linewidth of the light in the first structure. For example, the second structure may be implemented as second resonator structure 301 of FIG. 3, which comprises a phase-tuning mechanism 320. The second resonator structure 301 receives light from the first resonator structure 101 via optical coupling. Phase-tuning mechanism 320 may be controlled (e.g., via hardware processor 1402) to detune the phase of received light relative to the light in the first resonator structure 101. As described above, when the optical amplification mechanism 104 modulates the light in the first resonator structure and the phase-tuning mechanism 320 detunes the phase to align with the side mode of the light from the first resonator structure 101 that appears under modulation, the side mode is amplified and coupled to the lasing mode.

Hardware processor 1402 may execute instruction 1410 to output bandwidth enhanced light onto a bus waveguide. The bus waveguide may be optically coupled to the first resonator structure 101. Due instruction 1408, the lasing mode couples with the side mode to provide an enhanced bandwidth for modulated light propagating in the first resonator structure 101. The coupled light is then transferred from the first resonator structure 101 to the bus waveguide 110 and output therefrom.

Figure 15:
FIG. 15 is an example computer system that may be used to implement various features of an optical multiplexer of the present disclosure.
Figure 15:
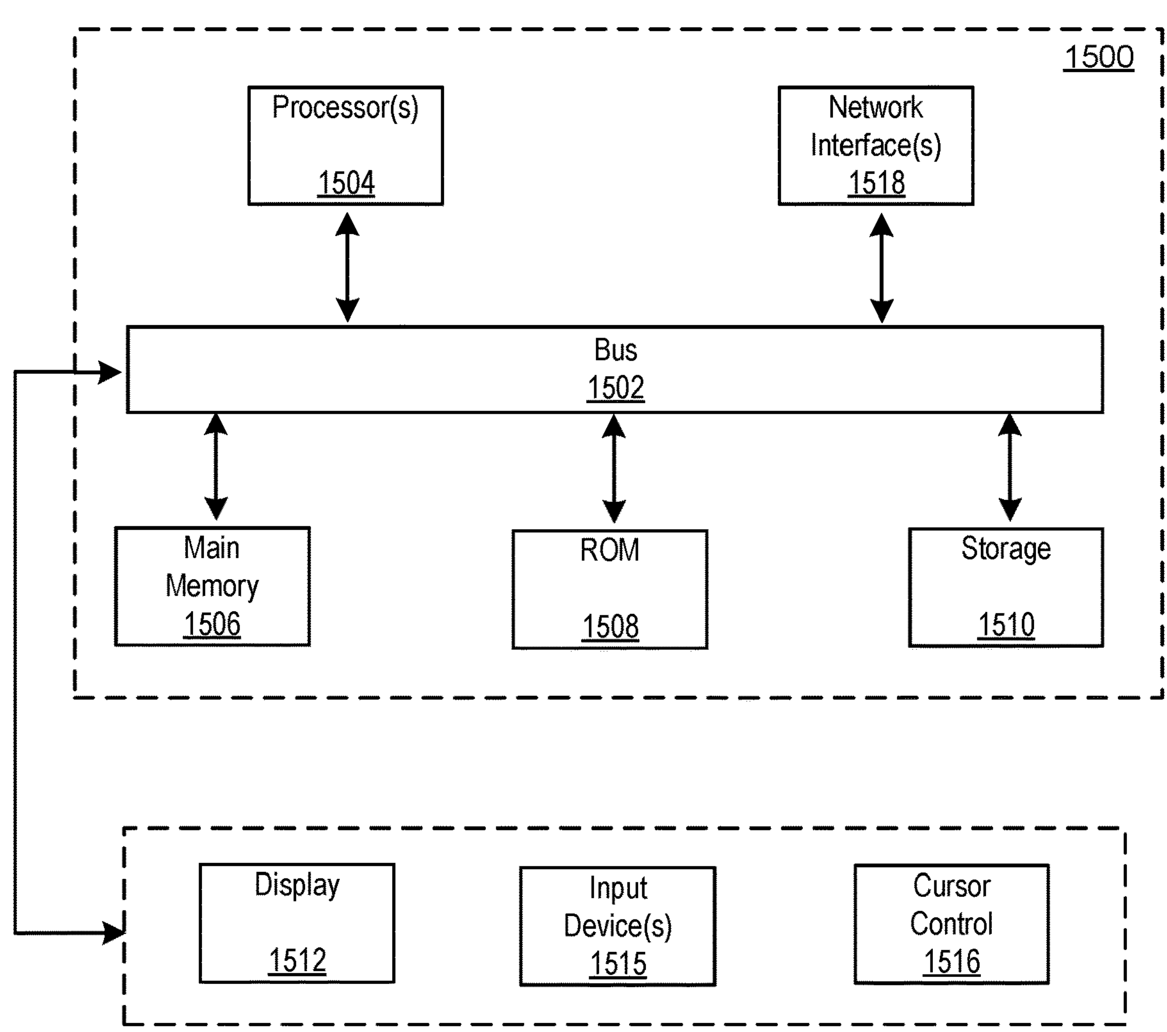

FIG. 15 depicts a block diagram of an example computer system 1500 in which various of the implementations described herein may be implemented. The computer system 1500 includes a bus 1502 or other communication mechanism for communicating information, one or more hardware processors 1504 coupled with bus 1502 for processing information. Hardware processor(s) 1504 may be, for example, one or more general purpose microprocessors. As described above, computer system 1500 may be implemented for controlling the power sources described above (e.g., power sources 260, 950, 960, 1050, 1060, 1150, and 1160).

The computer system 1500 also includes a main memory 1506, such as a random access memory (RAM), cache and/or other dynamic storage devices, coupled to bus 1502 for storing information and instructions to be executed by processor 1504. Main memory 1506 also may be used for storing temporary variables or other intermediate information during execution of instructions to be executed by processor 1504. Such instructions, when stored in storage media accessible to processor 1504, render computer system 1500 into a special-purpose machine that is customized to perform the operations specified in the instructions.

The computer system 1500 further includes a read only memory (ROM) 1508 or other static storage device coupled to bus 1502 for storing static information and instructions for processor 1504. A storage device 1510, such as a magnetic disk, optical disk, or USB thumb drive (Flash drive), etc., is provided and coupled to bus 1502 for storing information and instructions.

The computer system 1500 may be coupled via bus 1502 to a display 1512, such as a liquid crystal display (LCD) (or touch screen), for displaying information to a computer user. An input device 1514, including alphanumeric and other keys, is coupled to bus 1502 for communicating information and command selections to processor 1504. Another type of user input device is cursor control 1516, such as a mouse, a trackball, or cursor direction keys for communicating direction information and command selections to processor 1504 and for controlling cursor movement on display 1512. In some embodiments, the same direction information and command selections as cursor control may be implemented via receiving touches on a touch screen without a cursor.

The computing system 1500 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 1500 may implement the techniques described herein using customized hard-wired logic, one or more ASICs or FPGAs, firmware and/or program logic which in combination with the computer system causes or programs computer system 1500 to be a special-purpose machine. According to one embodiment, the techniques herein are performed by computer system 1500 in response to processor(s) 1504 executing one or more sequences of one or more instructions contained in main memory 1506. Such instructions may be read into main memory 1506 from another storage medium, such as storage device 1510. Execution of the sequences of instructions contained in main memory 1506 causes processor(s) 1504 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 1510. Volatile media includes dynamic memory, such as main memory 1506. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 1502. Transmission media can also take the form of acoustic or light waves, such as those generated during radio-wave and infra-red data communications.

The computer system 1500 also includes a communication interface 1518 coupled to bus 1502. Network interface 1518 provides a two-way data communication coupling to one or more network links that are connected to one or more local networks. For example, communication interface 1518 may be an integrated services digital network (ISDN) card, cable modem, satellite modem, or a modem to provide a data communication connection to a corresponding type of telephone line. As another example, network interface 1518 may be a local area network (LAN) card to provide a data communication connection to a compatible LAN (or WAN component to communicated with a WAN). Wireless links may also be implemented. In any such implementation, network interface 1518 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 1518, which carry the digital data to and from computer system 1500, are example forms of transmission media.

The computer system 1500 can send messages and receive data, including program code, through the network (s), network link and communication interface 1518. In the Internet example, a server might transmit a requested code for an application program through the Internet, the ISP, the local network and the communication interface 1518.

The received code may be executed by processor 1504 as it is received, and/or stored in storage device 1510, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 1500.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method for multiplexing, the method comprising:

generating single-mode light in a first resonator structure, the first resonator structure comprising an optical amplification mechanism and a single mode filter;

modulating optical gain of the first resonator structure between a cold cavity condition and a second gain condition via the optical amplification mechanism to generate a side mode different from a lasing mode generated at the cold cavity condition that propagates in the first resonator structure;

detuning a second resonator structure relative to a phase of the single-mode light generated in the first resonator structure to one-half a cold cavity linewidth of the lasing mode, wherein the detuning aligns a phase of light propagating in the second resonator structure with the side mode generated at the second gain condition to resonantly amplify the side mode, the light propagating in the second resonator structure is received via optical coupling between the first and second resonator structures; and outputting a bandwidth enhanced light onto a bus waveguide via optically coupling to the first resonator structure, the bandwidth enhanced light comprising the single-mode light from the first resonator structure and the amplified side mode.

2. The method of claim 1, further comprising applying a voltage bias to the optical amplification mechanism, wherein the optical amplification mechanism comprises one or more of quantum dots, quantum wells, and quantum-dashed structure that emit light responsive to the applied voltage bias.

3. The method of claim 1, further comprising:

coupling the side mode with the lasing mode to produce the bandwidth enhanced light based on the detuning of light propagating in a second resonator structure relative to a phase of the single-mode light generated in the first resonator structure to ne-half the cold cavity linewidth, wherein the side mode is resonantly amplified in the second resonator structure.

4. The method of claim 1, wherein detuning a phase of light propagating in a second resonator structure relative to a phase of the single-mode light generated in the first resonator structure to one-half the cold cavity linewidth comprises controlling a phase-tuning mechanism, coupled to the second resonator structure, to tune a resonant frequency of the second resonator structure based on one or more of carrier injection, charge depletion, and changing temperature of at least a portion of the second resonator structure.

5. The method of claim 1, further comprising setting a quality factor (Q factor) of the first resonator structure to be approximately equal to a Q factor of the second resonator structure.

6. The method of claim 1, further comprising tuning a coupling coefficient of optical coupling between the first and second resonator structures.

7. The method of claim 6, wherein tuning the coupling coefficient comprises tuning the coupling coefficient to provide constructive interference between the side mode generated at the second gain condition and the light propagating in the second resonator.

8. The method of claim 1, wherein the second resonator structure is a passive structure that does not include any optical amplification mechanisms.

9. The method of claim 1, wherein the optical amplification mechanism is configured to generate light through self-seeding.

10. The method of claim 1, wherein the first and second resonator structures are micro-ring structures.

11. The method of claim 1, wherein the amplified side mode couples with the single-mode light in the first resonator structure based on the modulating of the optical gain to provide the bandwidth enhanced light, wherein the bandwidth enhanced light has a bandwidth that is wider than the cold cavity linewidth of the single-mode light.

12. The method of claim 1, wherein the optical amplification mechanism comprises:

a cathode formed on a waveguide of the first resonator structure;

a mesa structure formed on the cathode, the mesa structure comprising an optically active medium; and an anode formed on the mesa structure, wherein the optically active medium generates and emits light based on a bias applied between the cathode and the anode.

13. The method of claim 4, wherein the phase-tuning mechanism comprises a heterogeneous metal oxide semiconductor (MOS) capacitor.

14. An optical multiplexer comprising:

a first resonator structure comprising an optical amplification mechanism and a single mode filter that generates single-mode light in the first resonator structure, wherein the optical amplification mechanism generates a side mode different from a lasing mode generated at a cold cavity condition that propagates in the first resonator structure by modulating optical gain of the first resonator structure between the cold cavity condition and a second gain condition;

a second resonator structure optically coupled to the first resonator structure, the second resonator structure comprising a phase-tuning mechanism that detunes the second resonator structure relative to a phase of the single-mode light generated in the first resonator structure to one-half a cold cavity linewidth of the lasing mode, wherein the detuning aligns a phase of light propagating in the second resonator structure with the side mode generated at the second gain condition to resonantly amplify the side mode, and wherein the light propagating in the second resonator structure is received via optical coupling between the first and second resonator structures; and a bus waveguide optically coupled to the first resonator structure, wherein a bandwidth enhanced light is output onto the bus waveguide via optically coupling to the first resonator structure, wherein the bandwidth enhanced light comprises the single-mode light from the first resonator structure and the amplified side mode.

15. The optical multiplexer of claim 14, wherein the second resonator structure is a passive structure that does not include any optical amplification mechanisms.

16. The optical multiplexer of claim 14, wherein the optical amplification mechanism is configured to generate light through self-seeding.

17. The optical multiplexer of claim 14, wherein the first and second resonator structures are micro-ring structures.

18. The optical multiplexer of claim 14, wherein the optical amplification mechanism comprises:

a cathode formed on a waveguide of the first resonator structure;

a mesa structure formed on the cathode, the mesa structure comprising an optically active medium; and an anode formed on the mesa structure, wherein the optically active medium generates and emits light based on a bias applied between the cathode and the anode.

19. The optical multiplexer of claim 14, wherein the phase-tuning mechanism comprises a heterogeneous metal oxide semiconductor (MOS) capacitor.

20. The optical multiplexer of claim 19, wherein the MOS capacitor comprises:

a first semiconductor material layer comprising a first material formed in a waveguide of the second resonator structure;

a second semiconductor material layer formed in the waveguide and comprising a second material that is different from the first material; and an interfacial oxide layer formed between the first semiconductor material layer and the second semiconductor material layer, wherein changes in carrier concentration occurs at the interfacial oxide layer based on a bias applied to the first and second semiconductor material layers, wherein the changes in carrier concentration induce a phase shift in the waveguide.

* * * * *